(12) United States Patent
Lin

(10) Patent No.: US 10,383,241 B2
(45) Date of Patent: Aug. 13, 2019

(54) CAPPING MEMBER, HOUSING ASSEMBLY, AND ELECTRONIC

(71) Applicant: GUANGDONG OPPO MOBILE TELECOMMUNICATIONS CORP., LTD., Dongguan, Guangdong (CN)

(72) Inventor: Yugui Lin, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/869,690

(22) Filed: Jan. 12, 2018

(65) Prior Publication Data

US 2018/0213663 A1  Jul. 26, 2018

(30) Foreign Application Priority Data

Jan. 26, 2017 (CN) .................... 2017 2 0098817 U

(51) Int. Cl.
  *H05K 5/02* (2006.01)
  *H05K 5/00* (2006.01)
  (Continued)

(52) U.S. Cl.
  CPC ............. *H05K 5/0226* (2013.01); *E05D 7/00* (2013.01); *E05D 11/0054* (2013.01);
  (Continued)

(58) Field of Classification Search
  CPC .. H05K 5/0226; H05K 5/0239; H05K 5/0017; E05D 7/00; E05D 11/0054;
  (Continued)

(56) References Cited

U.S. PATENT DOCUMENTS

2012/0307472 A1  12/2012  Bohn et al.
2014/0174226 A1*  6/2014  Hsu .................. E05D 3/122
                                                      74/98
(Continued)

FOREIGN PATENT DOCUMENTS

CM    204940566 U    1/2016
CN    101198238 A    6/2008
(Continued)

OTHER PUBLICATIONS

Extended European Search Report issued in corresponding European Application No. 18152077.6-1221 dated May 30, 2018 (9 pages).

(Continued)

*Primary Examiner* — Rockshana D Chowdhury
(74) *Attorney, Agent, or Firm* — Ladas & Parry LLP

(57) ABSTRACT

A capping member is provided. The capping member is adapted to a flexible display panel. The capping member includes a first side wall, a second side wall opposite to the first side wall, a plurality of holes located between the first side wall and the second side wall. The first side wall is configured to be coupled to a side of the flexible display panel. The first side wall and the second side wall are bendable with the side of the flexible display panel and a configuration of each of the plurality of holes are changeable during bending the first side wall and the second side wall. A housing assembly and an electronic device are also provided.

19 Claims, 29 Drawing Sheets

(51) Int. Cl.
*G06F 1/16* (2006.01)
*H04M 1/02* (2006.01)
*E05D 7/00* (2006.01)
*E05D 11/00* (2006.01)
*F16C 11/04* (2006.01)

(52) U.S. Cl.
CPC ............ *F16C 11/04* (2013.01); *G06F 1/1618* (2013.01); *G06F 1/1652* (2013.01); *G06F 1/1681* (2013.01); *H04M 1/0268* (2013.01); *H05K 5/0017* (2013.01); *H05K 5/0239* (2013.01); *E05Y 2900/606* (2013.01); *H04M 1/0216* (2013.01)

(58) Field of Classification Search
CPC ...... G06F 1/1652; G06F 1/1618; F16C 11/04; H04M 1/0268; H04M 1/0216; E05Y 2900/606
USPC .......................................................... 361/728
See application file for complete search history.

(56) References Cited

U.S. PATENT DOCUMENTS

| | | |
|---|---|---|
| 2015/0077917 A1 | 3/2015 | Song |
| 2015/0131222 A1 | 5/2015 | Kauhaniemi et al. |
| 2015/0233162 A1 | 8/2015 | Lee et al. |
| 2016/0116944 A1* | 4/2016 | Lee ...................... H04M 1/022 361/679.26 |
| 2016/0179236 A1 | 6/2016 | Shin et al. |
| 2016/0195901 A1* | 7/2016 | Kauhaniemi ......... G06F 1/1652 361/679.27 |
| 2016/0342180 A1 | 11/2016 | Xin et al. |
| 2018/0059740 A1 | 3/2018 | Kato |
| 2018/0110139 A1 | 4/2018 | Seo et al. |
| 2018/0164852 A1 | 6/2018 | Lim et al. |
| 2018/0198896 A1 | 7/2018 | Kang et al. |
| 2018/0329460 A1 | 11/2018 | Song |

FOREIGN PATENT DOCUMENTS

| | | |
|---|---|---|
| CN | 103206453 A | 7/2013 |
| CN | 105407194 A | 3/2016 |
| CN | 105516410 A | 4/2016 |
| CN | 105549682 A | 5/2016 |
| CN | 106328007 A | 1/2017 |
| CN | 106559531 A | 4/2017 |
| CN | 106603773 A | 4/2017 |
| CN | 106941540 A | 7/2017 |
| CN | 107071096 A | 8/2017 |
| CN | 206559412 U | 10/2017 |
| CN | 206585598 U | 10/2017 |
| EP | 3109847 A | 12/2016 |
| JP | 200365320 A | 3/2003 |

OTHER PUBLICATIONS

Extended European Search Report issued in corresponding European Application No. 18152248.3-1216, dated Jun. 25, 2018 (8 pages).
International Search Report issued in corresponding International application No. 2018073104, dated Mar. 28, 2018 (10 pages).
International Search Report issued in corresponding International application No. 2018073103, dated Apr. 16, 2018 (10 pages).
Office Action issued in corresponding U.S. Appl. No. 15/869,432, dated Jan. 23, 2019 (17 pages).

* cited by examiner

CAPPING MEMBER, HOUSING ASSEMBLY, AND ELECTRONIC

CROSS-REFERENCE TO RELATED APPLICATION

This application claims priority to a Chinese application No. 201720098817.6 filed on Jan. 26, 2017, titled "PACKAGING MEMBER, HOUSING ASSEMBLY, DISPLAY DEVICE AND MOBILE TERMINAL". The entirety of the above-mentioned applications is hereby incorporated by reference herein.

TECHNICAL FIELD

The present disclosure relates to the field of consumer electronics in general. More particularly, and without limitation, the disclosed embodiments relate to a capping member, a housing assembly, and an electronic device.

BACKGROUND

Electronic devices with large screen play an excellent role in improving user experience and visual effect, and possess obvious advantages particularly in business communication, playing games, watching movies and the like.

Currently, a foldable electronic device may have a large display panel. The large display panel can satisfy demand of a user for larger screen. The large display panel can be folded so that a size of the foldable electronic device is reduced. Thus, it is convenient for a user to carry the foldable electronic device with small size. Generally, the large display panel of the foldable electronic device is a flexible display panel with a bendable side. The bendable side is packaged with a capping member to protect the flexible display panel.

SUMMARY

In accordance with an aspect, in one embodiment of the present disclosure, a capping member is provided. The capping member is adapted to a flexible display panel. The capping member may include a first side wall, a second side wall opposite to the first side wall, a number of holes located between the first side wall and the second side wall. The first side wall is configured to be coupled to a side of the flexible display panel. The first side wall and the second side wall are bendable with the side of the flexible display panel and a configuration of each of the plurality of holes are changeable during bending the first side wall and the second side wall.

In accordance with another aspect, in one embodiment of the present disclosure, a housing assembly for an electronic device is provided. The housing assembly may include a connecting member and a capping member. The connecting member is configured to support a flexible display panel of the electronic device. The connecting member has a connecting side overlapped with a side of the flexible display panel. The connecting side is bendable. The capping member includes a first side wall, a second side wall opposite to the first side wall, a number of holes located between the first side wall and the second side wall. The first side wall is configured to cover the connecting side and the side of the flexible display panel. The first side wall and the second side wall are bendable with the side of the flexible display panel and a configuration of each of the plurality of holes are changeable during bending the first side wall and the second side wall.

In accordance with a still another aspect, in one embodiment of the present disclosure, an electronic device is provided. The electronic device may include a housing assembly, a flexible display panel and an electronic component group. The housing assembly may include a connecting member and a capping member. The connecting member is configured to support the flexible display panel. The connecting member has a connecting side. The connecting side is bendable. The capping member may include a first side wall, a second side wall opposite to the first side wall, a number of holes located between the first side wall and the second side wall. The flexible display panel is positioned on the housing assembly and the first side wall of the capping member. The electronic component group is positioned in the housing assembly and electrically connected to the flexible display panel.

BRIEF DESCRIPTION OF THE DRAWINGS

The accompanying drawings, which are incorporated in and constitute a part of this specification, illustrate exemplary embodiments of the present disclosure, and together with the description, serve to explain the principles of the disclosure.

DETAILED DESCRIPTION OF EMBODIMENTS

This description and the accompanying drawings that illustrate exemplary embodiments should not be taken as limiting. Various mechanical, structural, electrical, and operational changes may be made without departing from the scope of this description and the claims, including equivalents. In some instances, well known structures and techniques have not been shown or described in detail so as not to obscure the disclosure. Similar reference numbers in two or more figures represent the same or similar elements. Furthermore, elements and their associated features that are disclosed in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

As used herein, a "communication terminal" (or simply a "terminal") includes, but is not limited to, a device that is configured to receive/transmit communication signals via a wireline connection, such as via a public-switched telephone network (PSTN), digital subscriber line (DSL), digital cable, a direct cable connection, and/or another data connection/network, and/or via a wireless interface with, for example, a cellular network, a wireless local area network (WLAN)1 a digital television network such as a DVB-H network, a satellite network, an AM/FM broadcast transmitter, and/or another communication terminal. A communication terminal that is configured to communicate over a wireless interface may be referred to as a "wireless communication terminal," a "wireless terminal" and/or a "mobile terminal." Examples of mobile terminals include, but are not limited to, a satellite or cellular radiotelephone; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver.

Figure 1:
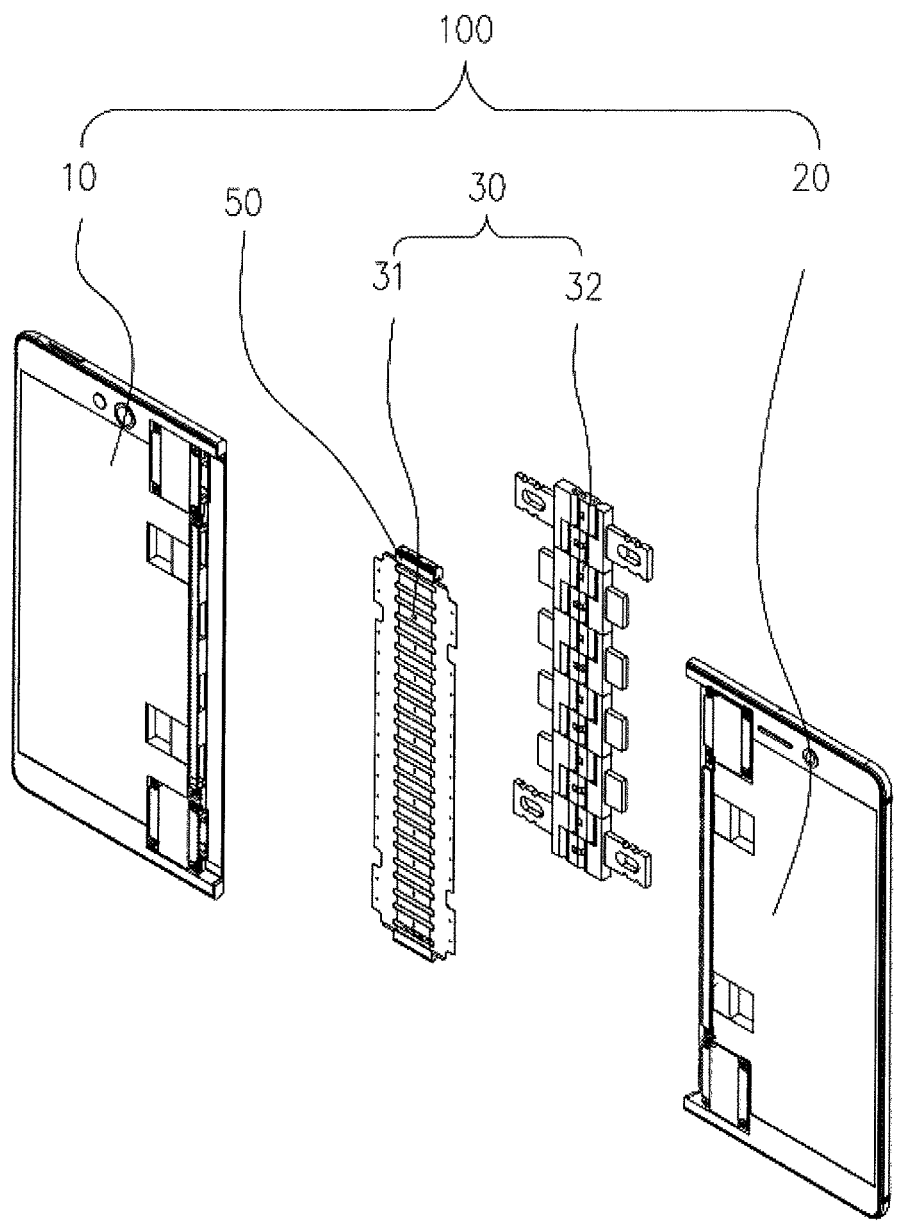
FIG. 1 illustrates an exploded view of a housing assembly, in accordance with an embodiment of the present disclosure.

FIG. 1 illustrates an exploded view of a housing assembly 100, in accordance with an embodiment of the present disclosure. The housing assembly 100 includes a first housing 10, a second housing 20, a connecting module 30 and a capping member 50. The connecting module 30 is located between the first housing 10 and the second housing 20 and is configured for coupling the first housing 10 to the second housing 20. The second housing 20 can be rotated with respect to the first housing 10 by the connecting module 30. Thus, the housing assembly 100 can be in a folded configuration, an angular configuration or an unfolded configuration. In the folded configuration, the second housing 20 can be rotated with respect to the first housing 10, and then be turned over and stacked onto the first housing 10. In the unfolded configuration, the first housing 10 and the second housing 20 can be substantially arranged in a plane. The angular configuration is a status between the unfolded configuration and the folded configuration. In other words, in the angular configuration, the first housing 10 and the second housing 20 may define an angle between 0 and 180°. In other embodiment, in the angular configuration, the first housing 10 and the second housing 20 may form an angle more than 180°. The connecting module 30 is also configured to prevent a detachment of the second housing 20 and the first housing 10 in the folded configuration or the angular configuration.

The connecting module 30 includes a connecting member 31 and a coupling member 32. The connecting member 31 is located between the first housing 10 and the second housing 20. One side of the connecting member 31 is coupled to the first housing 10, the other side of the connecting member 31 is coupled to the second housing 20. The coupling member 32 faces the connecting member 31. The coupling member 32 is also located between the first housing 10 and the second housing 20. One side of the coupling member 32 is slidably coupled to the first housing 10, the other side of the coupling member 32 is slidably coupled to the second housing 20. The coupling member 32 is configured to support the connecting member 31.

The connecting member 31 is bendable, and even foldable. The first housing 10 and the second housing 20 can be angular or stacked by bending the connecting member 31. When the connecting member 31 is straight along a direction perpendicular to a longitudinal direction of the connecting member 31, the first housing 10 and the second housing 20 can be arranged in a plane. The coupling member 32 of the connecting module 30 may also be bendable, and even foldable. In the folded configuration, the coupling member 32 can be folded to support the folded connecting member 31. In the unfolded configuration, the coupling member 32 can also be unfolded to support the unfolded connecting member 31. Further, in one example, the coupling member 32 may be slidably coupled to the first housing 10 and the second housing 20. From the unfolded configuration to the folded configuration, the coupling member 32 can slide towards the first housing 10 and the second housing 20. For example, the coupling member 32 can slide into the first housing 10 and the second housing 20. Otherwise, from the unfolded configuration to the folded configuration, the coupling member 32 can slide away from the first housing 10 and the second housing 20. For example, the coupling member 32 can slide out of the first housing 10 and the second housing 20. In another example, the coupling member 32 may be slidably coupled to one of the first housing 10 and the second housing 20. From the unfolded configuration to the folded configuration, the coupling member 32 can slide towards one of the first housing 10 or the second housing 20. For example, the coupling member 32 can slide into one of the first housing 10 and the second housing 20. From the unfolded configuration to the folded configuration, the coupling member 32 can slide away from one of the first housing 10 or the second housing 20. For example, the coupling member 32 can slide out of one of the first housing 10 and the second housing 20.

In the illustrated embodiment, the housing assembly 100 includes two capping members 50. The two capping members 50 are respectively disposed at two ends of the connecting member 31 along a longitudinal direction of the connecting member 31. One end of each capping member 50 is in contact with the first housing 10, the other end is in contact with the second housing 20. For example, one of the two capping members 50 is disposed at a first connecting side 313 (see FIG. 11) of the connecting member 31, the other of the two capping members 50 is disposed at a second connecting side 313' (see FIG. 11) of the connecting member 31. The two capping members 50 are configured to cover the two ends of the connecting module 30. Thus, the housing assembly 100 can have a good appearance.

Figure 2:
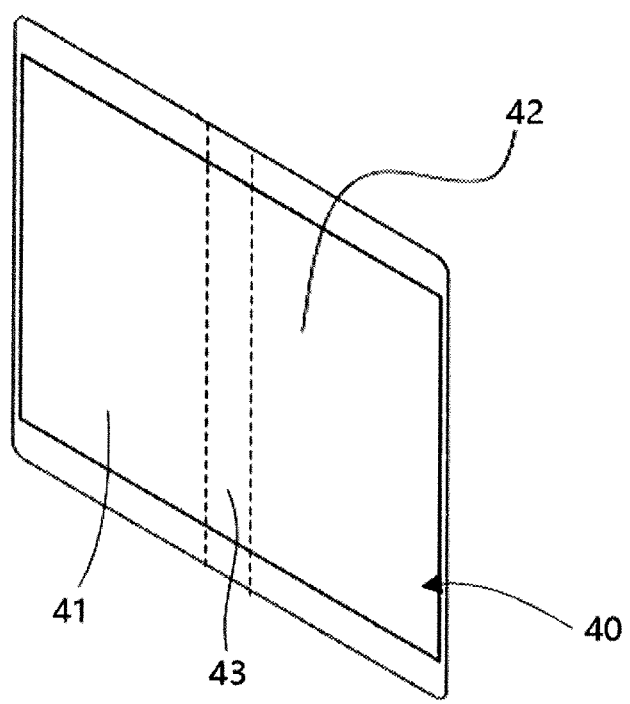
FIG. 2 illustrates a schematic view of a flexible display panel, in accordance with an embodiment of the present disclosure.

As illustrated in FIG. 2, the housing assembly 100 is configured to be assembled with a flexible display panel 40. The housing assembly 100 is also configured to be assembled with other components to form an electronic device such as a mobile terminal. In some embodiments, the electronic device can be, for example, smart mobile phones, tablets (PDA), laptops, etc. In the present embodiment, the first housing 10 and the second housing 20 of the housing assembly 100 may be made of a rigid material. Thus, the housing assembly 100 can provide support and protection to the flexible display panel 40. As illustrated in FIG. 2, the flexible display panel 40 includes a first portion 41, a second portion 42 and a third portion 43. The third portion 43 is located between the first portion 41 and the second portion 42. One side of the third portion 43 is coupled to the first portion 41, the other side of the third portion 43 is coupled to the second portion 42. The first housing 10 is configured for supporting the first portion 41, and the second housing 20 is configured for supporting the second portion 42. The connecting module 30 is configured for supporting the third portion 43.

Figure 3:
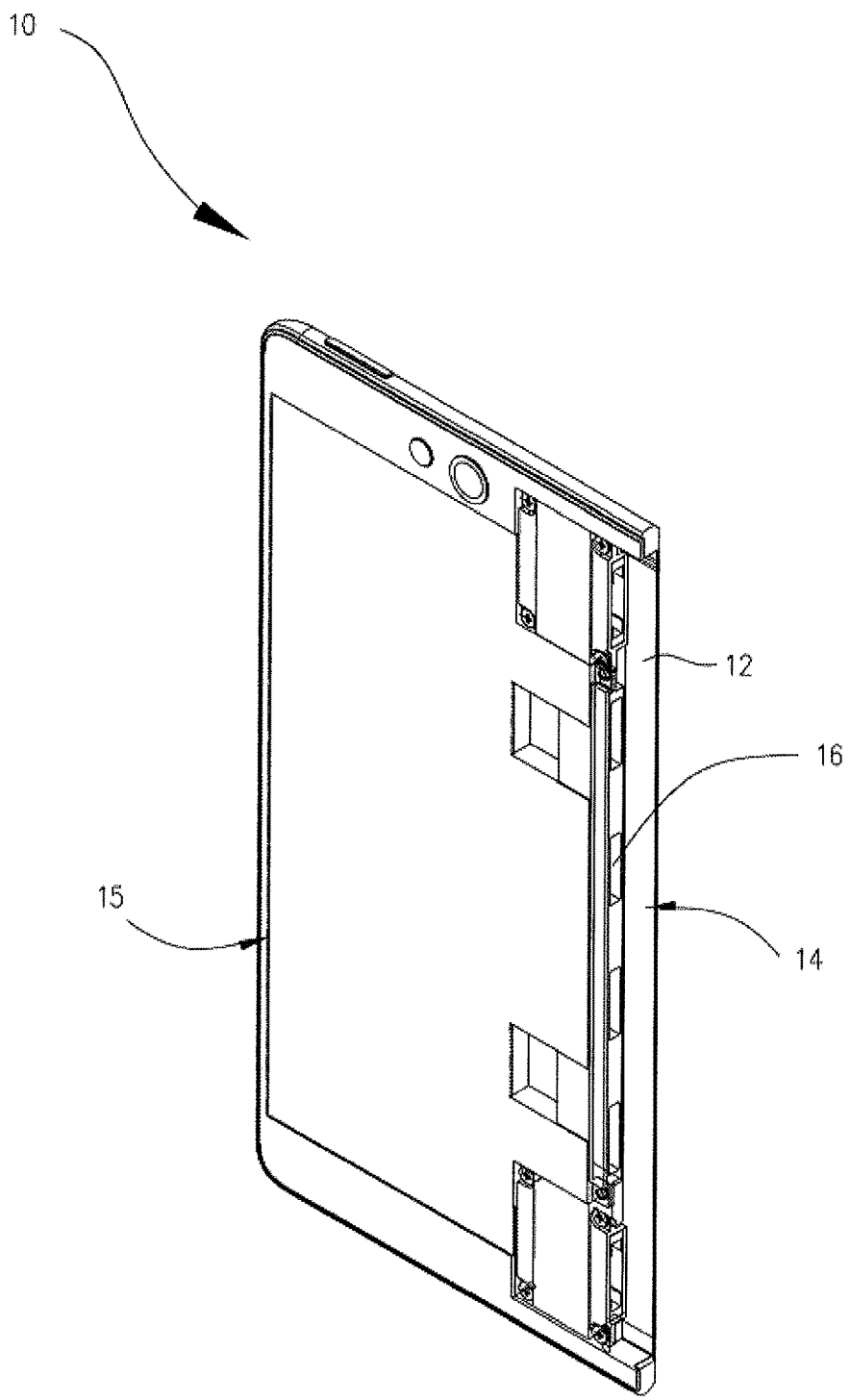
FIG. 3 illustrates an assembly view of a first housing of the housing assembly shown in FIG. 1.
Figure 4:
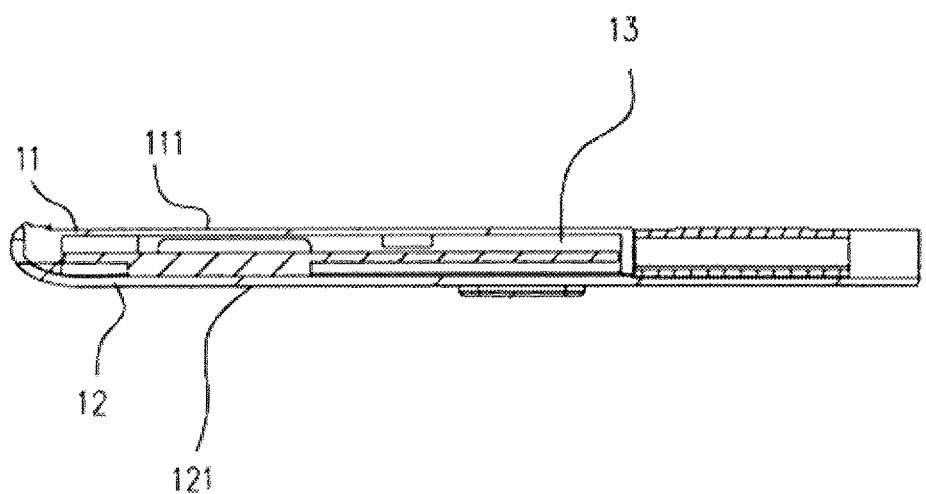
FIG. 4 illustrates a cross-sectional schematic view of a first housing of the housing assembly shown in FIG. 1.
Figure 5:
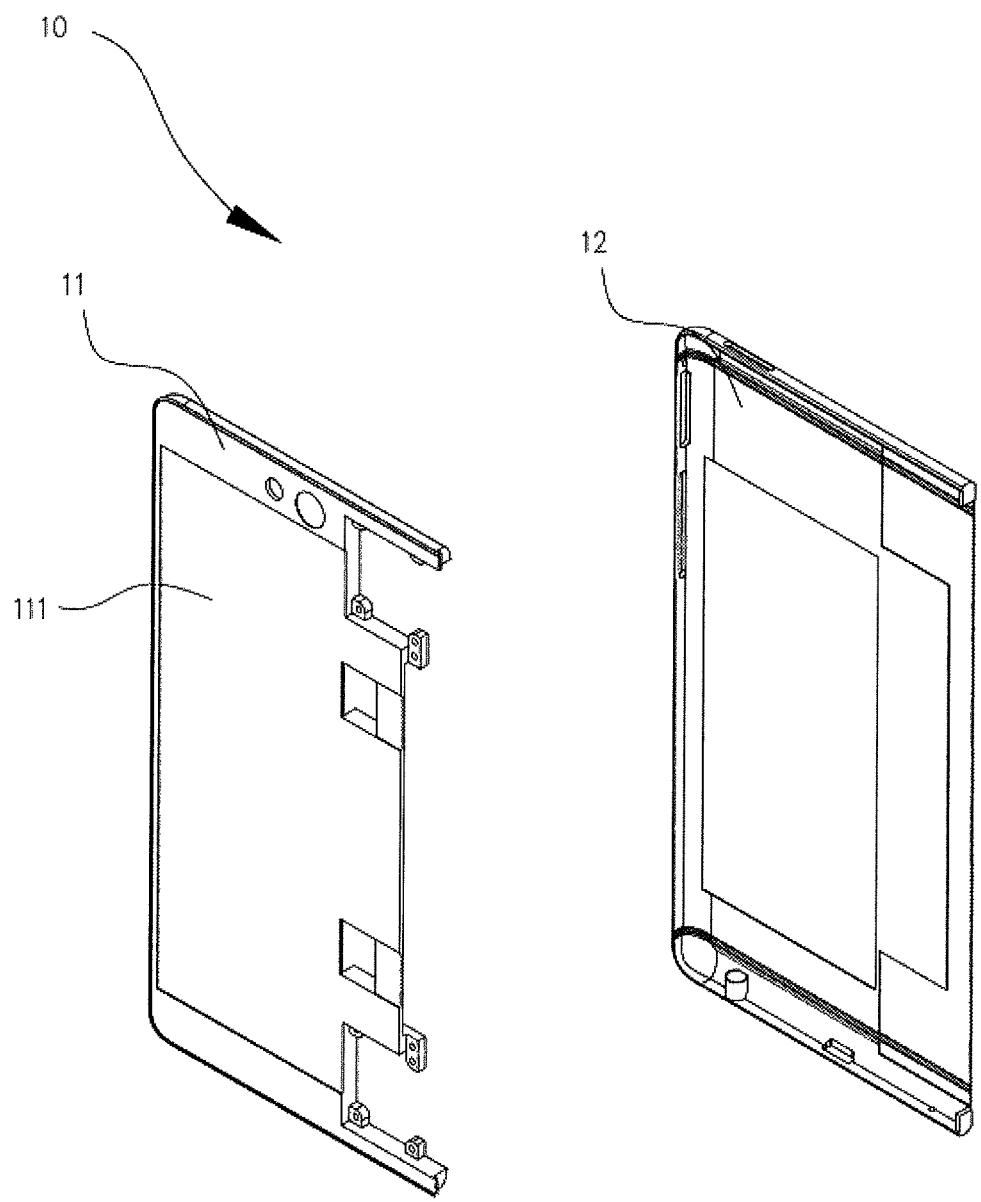
FIG. 5 illustrates an exploded view of a first housing of the housing assembly shown in FIG. 1.

The first housing 10, as illustrated in FIG. 3-FIG. 5, includes a first front cover 11 and a first rear cover 12. The first rear cover 12 is coupled to the first front cover 11 to form a first accommodating cavity 13. The first accommodating cavity 13 is configured for accommodating other components such as an electronic component group. The first front cover 11 has a first supporting surface 111. The first supporting surface 111 is configured for supporting the first portion 41 of the flexible display panel 40. The first rear cover 12 is coupled to the first front cover 11 and located on a side of the first front cover 11 opposite to the first supporting surface 111. The first rear cover 12 has a first rear surface 121 far away from the first front cover 11. The first housing 10 includes a first interior portion 14 and a first exterior portion 15. The first interior portion 14 is coupled to the connecting module 30, and the first exterior portion 15 is far away from the connecting module 30. In the present embodiment, the first interior portion 14 is coupled to the connecting member 31 and the coupling member 32. The connecting member 31 is fixed to the first interior portion 14, and the coupling member 32 is slidably coupled to the first interior portion 14. The first exterior portion 15 is configured to be coupled to the first portion 41 of the flexible display panel 40. For example, an edge of the first portion 41 far away from the second portion 42 is coupled to the first exterior portion 15 of the first housing 10. The first portion 41 of the flexible display panel 40 is positioned on the first supporting surface 111. Thus, the first housing 10 can support the first portion 41 of the flexible display panel 40 effectively.

The coupling member 32 is slidably coupled to the first interior portion 14. The first interior portion 14 may have a first groove 16. The coupling member 32 can be partially received in the first groove 16. Thus, the coupling member 32 can slide with respect to the first interior portion 14. The coupling member 32 can slide either into or out of the first groove 16. As a result, the coupling member 32 will not be compressed by the first housing 10 from the unfolded configuration to the folded configuration, thereby avoiding a deformation of the coupling member 32.

Figure 6:
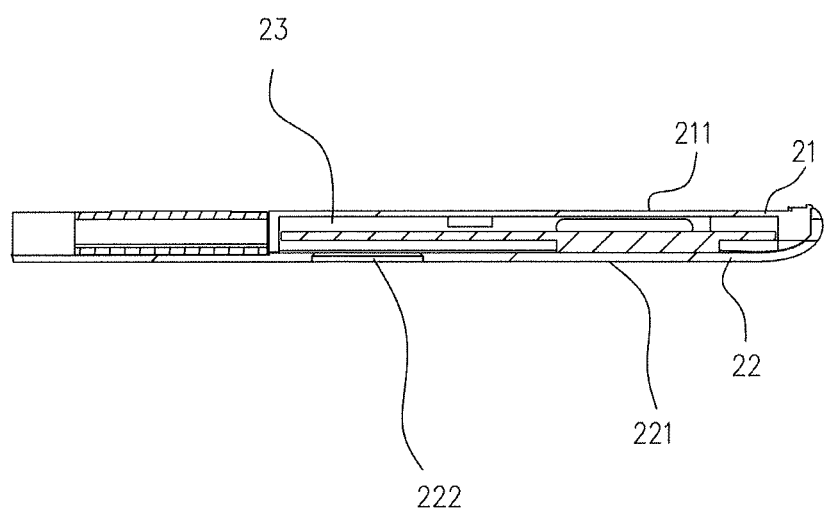
FIG. 6 illustrates a cross-sectional schematic view of a second housing of the housing assembly shown in FIG. 1.
Figure 7:
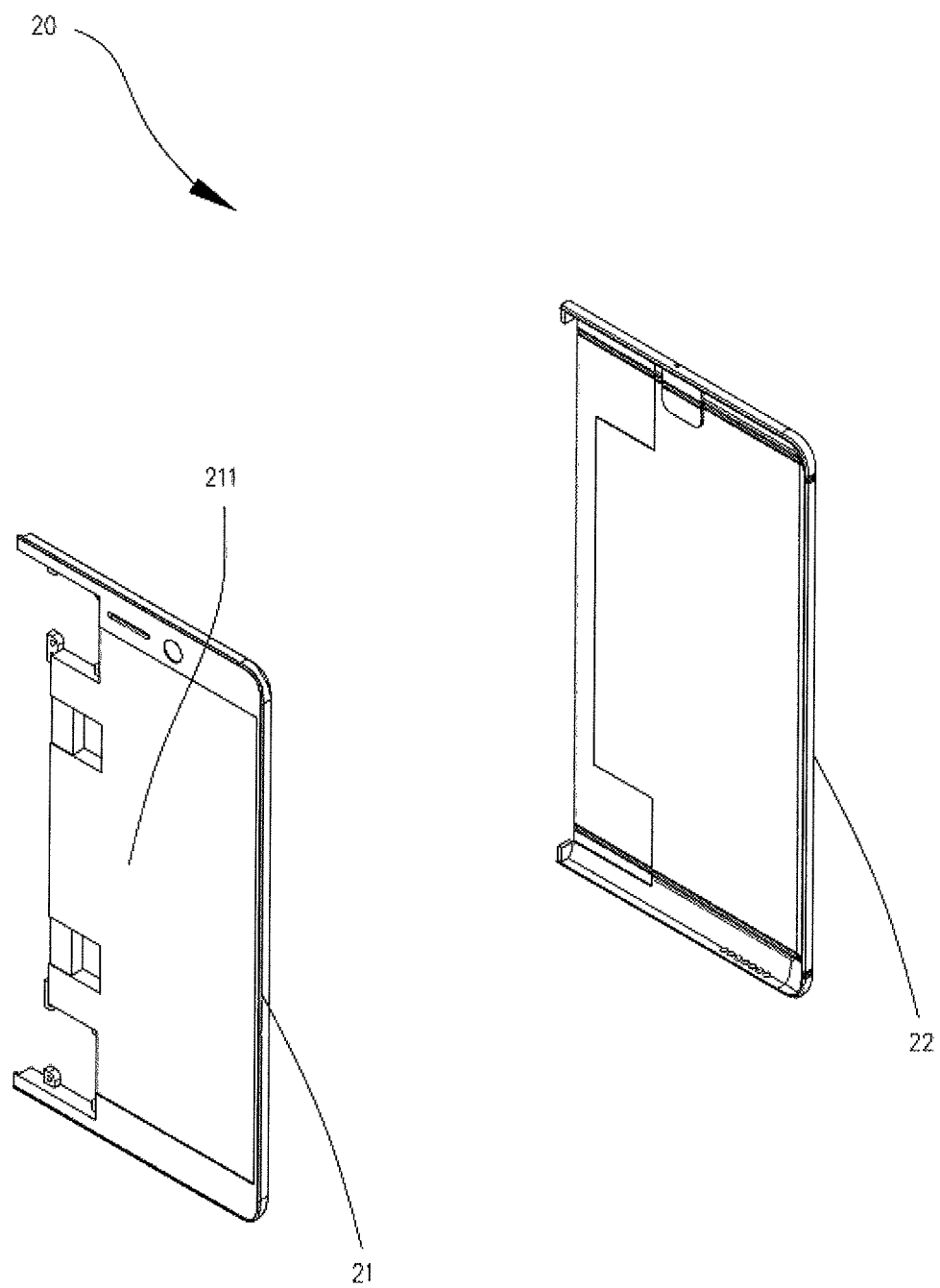
FIG. 7 illustrates an exploded view of a second housing of the housing assembly shown in FIG. 1.
Figure 8:
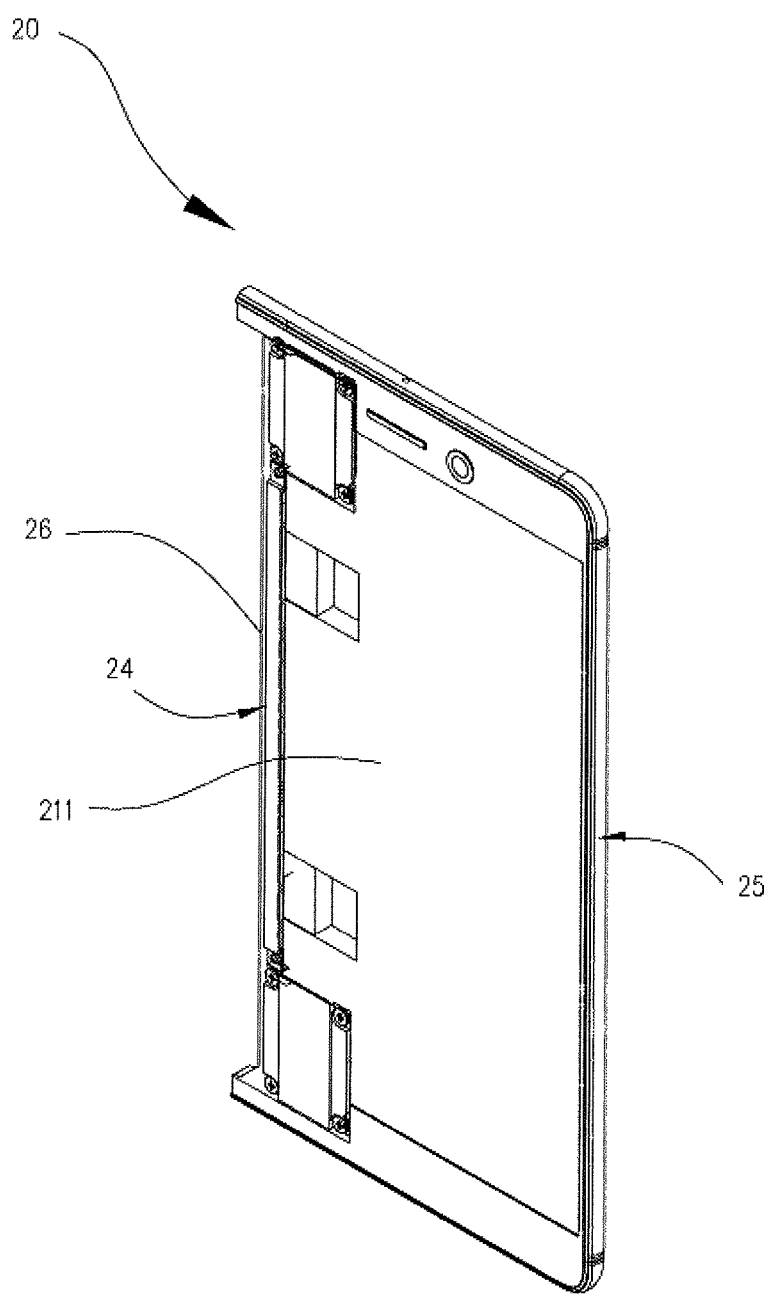
FIG. 8 illustrates an assembled view of a second housing of the housing assembly shown in FIG. 1.

As illustrated in FIG. 6, FIG. 7 and FIG. 8, the second housing 20 includes a second front cover 21 and a second rear cover 22. The second rear cover 22 is coupled to the second front cover 21 to form a second accommodating cavity 23. The second accommodating cavity 23 is configured for accommodating other components such as an electronic component group. The second front cover 21 includes a second supporting surface 211. The second supporting surface 211 is configured for supporting the second portion 42 of the flexible display panel 40 (as illustrated in FIG. 2). The second rear cover 22 may be coupled to the second front cover 21 and located on a side of the second front cover 21 opposite to the second supporting surface 211. The second rear cover 22 has a second rear surface 221 far away from the second front cover 21. The first supporting surface 111 and the second supporting surface 221 are configured for supporting the flexible display panel 40.

As illustrated in FIG. 8, the second housing 20 includes a second interior portion 24 and a second exterior portion 25. The second interior portion 24 is coupled to the connecting module 30, and the second exterior portion 25 is far away from the connecting module 30. In the present embodiment, the second interior portion 24 is coupled to the connecting member 31 and the coupling member 32. The connecting member 31 is fixed to the second interior portion 24, and the coupling member 32 is slidably coupled to the second interior portion 24. The second exterior portion 25 is configured to be coupled to the second portion 42 of the flexible display panel 40. For example, an edge of the second portion 42 far away from the first portion 41 is coupled to the second exterior portion 25 of the second housing 20. The second portion 42 of the flexible display panel 40 is positioned on the second supporting surface 211. Thus, the second housing 20 can support the second portion 42 of the flexible display panel 40 effectively. The second housing 20 is similar to the first housing 10.

The coupling member 32 is slidably coupled to the second interior portion 24. The second interior portion 24 may have a second groove 26. The coupling member 32 can be partially received in the second groove 26. Thus, the coupling member 32 can slide with respect to the second interior portion 24. The coupling member 32 can slide either into or out of the second groove 16. As a result, the coupling member 32 will not be compressed by the second housing 20 from the unfolded configuration to the folded configuration, thereby avoiding a deformation of the coupling member 32. The second groove 26 is similar to the first groove 16. The coupling member 32 can be partially received in at least one of the first groove 16 and the second groove 26 and is capable of sliding with respect to the first housing 10 and the second housing 20.

Figure 9:
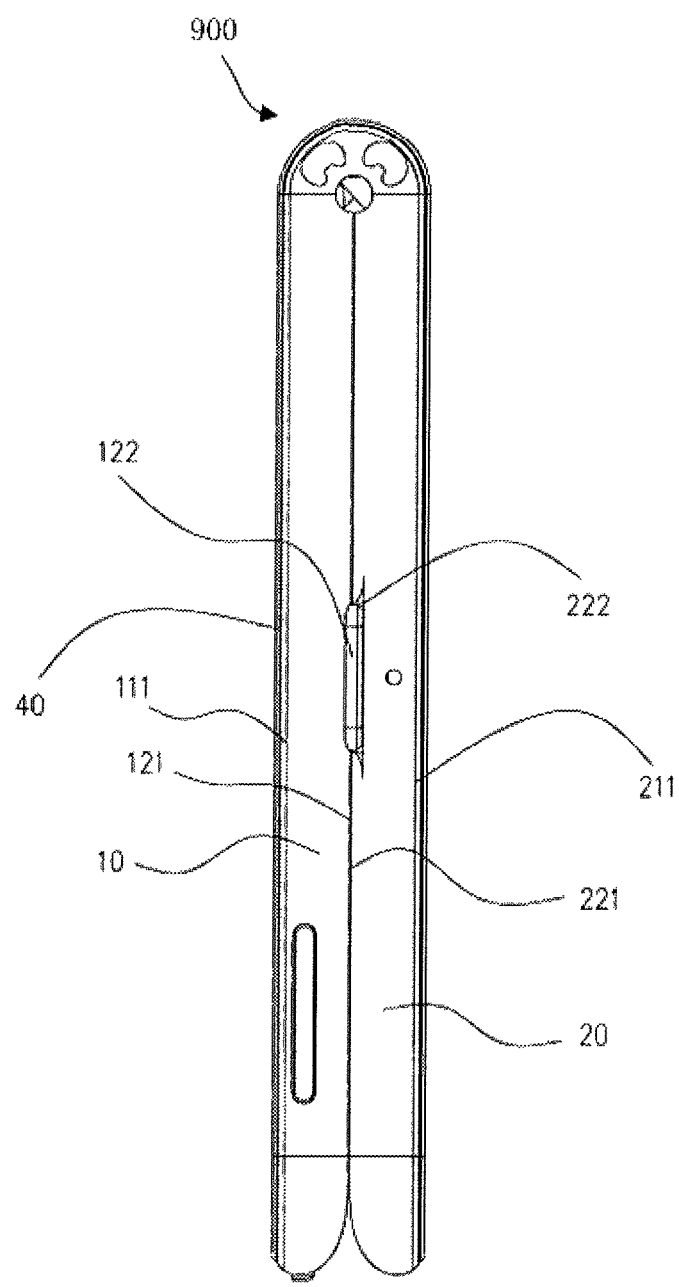
FIG. 9 illustrates a schematic view of a housing assembly with a flexible display panel in a folded configuration.

As illustrated in FIG. 9, in the embodiments of the present disclosure, a mobile terminal 900 having the housing assembly 100 is described as an example of the electronic device. When a mobile terminal 900 is in the folded configuration, the first rear surface 121 of the first rear cover 12 is attached to the second rear surface 221 of the second rear cover 22. The first supporting surface 111 and the second supporting surface 211 are located on two opposite sides of the mobile terminal 900. As show in FIG. 10, when the mobile terminal 900 is in the unfolded configuration, the first rear surface 121 of the first rear cover 12 is aligned to the second rear surface 221 of the second rear cover 22. The first supporting surface 111 and the second supporting surface 211 are located on the same side of the mobile terminal 900. That is, the first rear surface 121 of the first rear cover 12 and the second rear surface 221 of the second rear cover 22 are coplanar. The first supporting surface 111 and the second supporting surface 221 are configured for supporting the flexible display panel 40.

Figure 10:
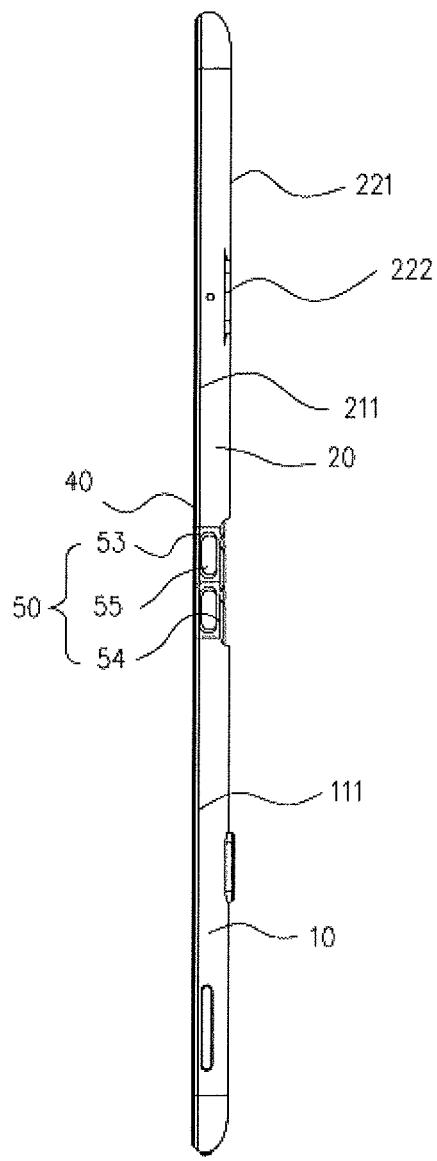
FIG. 10 illustrates a schematic view of a housing assembly with a flexible display panel in an unfolded configuration.

As illustrated in FIG. 9 and FIG. 10, in one embodiment, the first housing 10 may include a protruding portion 122. The protruding portion 122 is positioned on the first rear surface 121. The protruding portion 122 can be formed by a part of the other component such as an end of a camera, an end of a flash light or an end of a press button. That is, the protruding portion 122 is protruded from the first rear surface 121. Thus, a distance between the first supporting surface 111 and the first rear surface 121 can be reduced. A thickness of the first housing 10 can be reduced, thereby achieving a thin design. Correspondingly, the second rear surface 221 of the second housing 20 may define an indentation 222. In the folded configuration of the mobile terminal 900, the protruding portion 122 can be received in the indentation 222 so that the first rear surface 121 is attached to the second rear surface 221. A depth of indentation 222 can be either more than or equal to a height of the protruding portion 122 protruding from the first rear surface 121. Thus, in the folded configuration of the mobile terminal 900, the protruding portion 122 can be received in the indentation 222, and the protruding portion 122 will not be in contact with the second housing 20. Therefore, a service life of the housing assembly 100 can be increased, and the housing assembly 100 in the folded configuration can have a good appearance.

In the present embodiment, the mobile terminal 900 can be in the folded configuration, the angular configuration, or the unfolded configuration. From the unfolded configuration to the folded configuration or the angular configuration, the first housing 10 and the second housing 20 are close to each other by bending the connecting member 31 of the connecting module 30. From the folded configuration to the unfolded configuration or the angular configuration, the first housing 10 and the second housing 20 are far away from each other.

Figure 11:
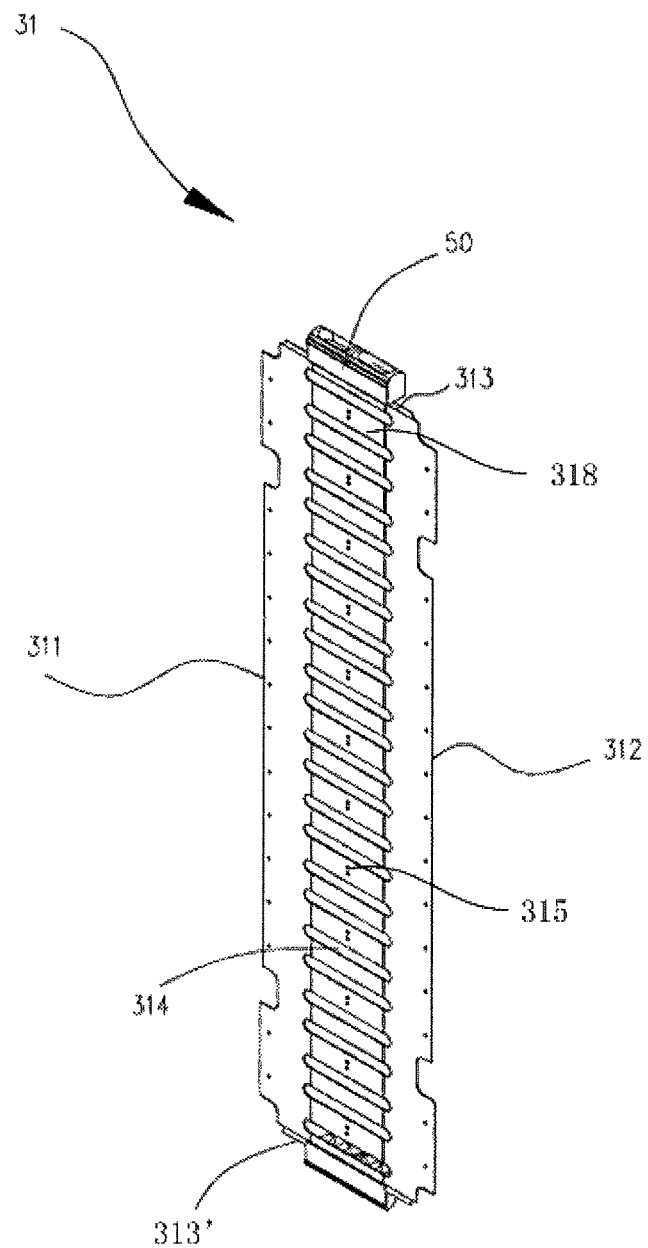
FIG. 11 illustrates a schematic view of the connecting member and the capping member of the housing assembly shown in FIG. 1.

The connecting member 31 is configured to couple a first housing 10 to a second housing 20. As illustrated in FIG. 11, the connecting member 31 includes a first connecting portion 311, a second connecting portion 312 and a body portion 318 between the first connecting portion 311 and the second connecting portion 312. The first connecting portion 311 and a second connecting portion 312 are located at two opposite sides of a longitudinal central line of the body portion 318. The first connecting portion 311 is configured to be coupled to the first housing 10, and the second connecting portion 312 is configured to be coupled to the second housing 20. The connecting member 31 is bendable, and even foldable. The first housing 10 and the second housing 20 can be angular or stacked by bending the connecting member 31. The first connecting portion 311, the second connecting portion 312 and the body portion 318 can be integrally formed. In some embodiments, the first connecting portion 311, the second connecting portion 312 and the body portion 318 can be individually formed and coupled.

The body portion 318 may include a first connecting side 313 and a second connecting side 313'. The first connecting portion 311 and the second connecting portion 312 are located two opposite sides of the connecting member 31. The first connecting side 313 and the second connecting side 313' are opposite and located between the first connecting portion 311 and the second connecting portion 312. A length of the first connecting portion 311 is equal to a length of the second connecting portion 312. The length of the first connecting portion 311 is more than a length of each of the first connecting side 313. The first connecting portion 311 is configured to be coupled to the first interior portion 14 of the first housing 10 (as illustrated in FIG. 5). The second connecting portion 312 is configured to be coupled to the second interior portion 24 of second housing 20 (as illustrated in FIG. 8). In one embodiment, the first connecting portion 311 is welded to the first interior portion 14. The second connecting portion 312 is welded to the second interior portion 24. The body portion 318 defines a number of through holes 314 therein. A number of through holes 314 are arranged along a longitudinal direction of the body portion 318. The through holes 314 are equally spaced. Each of the through holes 314 is strip-shaped, a longitudinal direction of each of the through holes 314 is perpendicular to a longitudinal direction of the body portion 318. That is, the longitudinal direction of each of the through holes 314 is substantially parallel to the first connecting side 313 and the second connecting side 313'. The through holes 314 can reduce an elastic stress of the connecting member 31 during bending the body portion 318. Thus, a force applied to the flexible display panel 40 by the connecting member 31 can be reduced. It is noted that, a configuration of each of the through holes 314 can be circle.

The first connecting portion 311 and the second connecting portion 312 may be either close to each other by bending the body portion 318. The first housing 10 can move with the first connecting portion 311, and the second housing 20 can move with the second connecting portion 312. Thus, the first housing 10 can be rotated relative to the second housing 20 to be close to each other, and then the mobile terminal 900 is folded by bending the body portion 318. Otherwise, the first housing 10 can be rotated relative to the second housing 20 to be far away from each other, and then the mobile terminal 900 is unfolded. The coupling member 32 can also folded or unfolded during bending or unbending the body portion 318 correspondingly. The first connecting side 313 and the second connecting side 313' are overlapped with two opposite sides of the flexible display panel 40. Thus, the connecting member 31 can support the flexible display panel 40 and the housing assembly 100 can have a good appearance. The connecting member 31 can be made of an elastic steel sheet. Thus, the connecting member 31 can support the flexible display panel 40 effectively.

It is noted that, the first connecting portion 311 of the connecting member 31 can be coupled to the first interior portion 14 of the first housing 10 by means of screw. The second connecting portion 312 of the connecting member 31 can be coupled to the second interior portion 24 of the first housing 10 by means of screw.

Further, the body portion 318 may define a number of welding holes 315 therein. The welding holes 315 can be arranged along a longitudinal direction of the body portion 318. Each of the welding holes 315 has a geometric center, the geometric centers of the welding holes 315 are arranged along the longitudinal central line of the body portion 318. The welding holes 315 are configured for welding the coupling member 32 to the body portion 318. Thus, the coupling member 32 welded to the body portion 318 can be prevented from a movement along a direction perpendicular to the longitudinal direction of the body portion 318 (i.e., perpendicular to a sliding direction of the coupling member 32) with respect to the connecting member 31.

Figure 12:
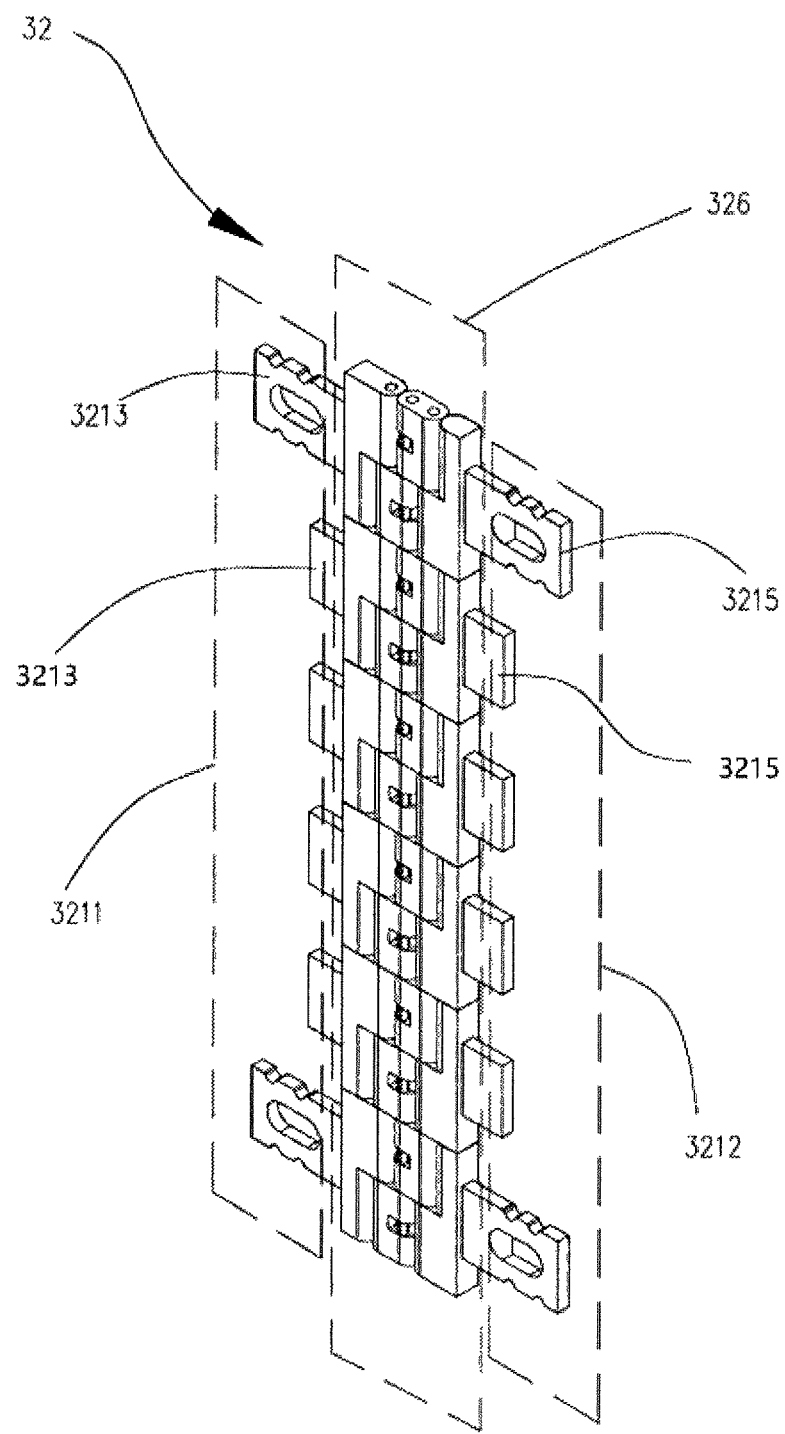
FIG. 12 illustrates a schematic view of a coupling member of a connecting module of the housing assembly shown in FIG. 1.
Figure 13:
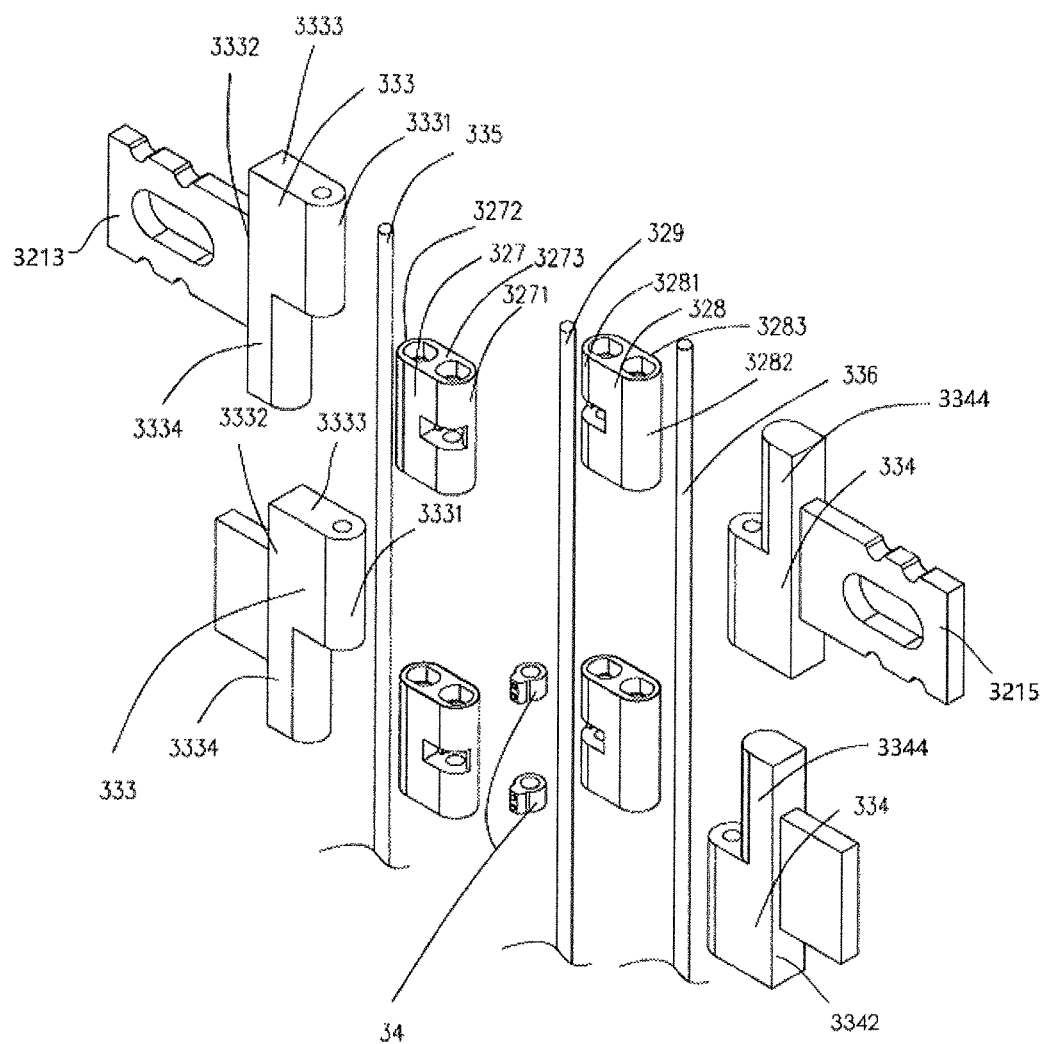
FIG. 13 illustrates a partial schematic view of the coupling member shown in FIG. 12.

As illustrated in FIG. 12 and FIG. 13, in an exemplary embodiment, the coupling member 32 may include a first connection part 3211 (a part in a region defined by a dotted line) and a second connection part 3212 (a part in a region defined by a dotted line). The first connection part 3211 is slidably coupled to the first housing 10, and the second connection part 3212 is slidably coupled to the second housing 20. The first connection part 3211 includes a first sliding plate 3213, the second connection part 3212 includes a second sliding plate 3215. The first sliding plate 3213 is slidably coupled to the first housing 10, and the second sliding plate 3215 is slidably coupled to the second housing 20.

The coupling member 32 further includes a linkage part 326 (a part located in a region defined by a dotted line in FIG. 12). The linkage part 326 includes at least one first hinge element 327, at least one second hinge element 328 and a hinge shaft 329 for pivotally coupling the first hinge element 327 and the second hinge element 328. The first hinge element 327 can be rotated with respect to the second hinge element 328 by the hinge shaft 329. The first connection part 3211 and the second connection part 3212 can be either close to or far away from each other by a rotation of at least one of the first hinge element 327 and the second hinge element 328 around the hinge shaft 329. The first connection part 3211 is configured to be coupled the first housing 10, the second connection part 3212 is configured to be coupled the second housing 20. The first connection parts 3211 and the second connection part 3212 of the coupling member 32 are symmetrical with respect to the hinge shaft 329. A distance of the hinge shaft 329 and the first housing 10 is substantially equal to a distance of the hinge shaft 329 and the second housing 20. The hinge shaft 329 is substantially overlapped with a geometric central line of the connecting member 31. The linkage part 326 can be folded and unfolded by rotating the first hinge element 327 and the second hinge element 328 around the hinge shaft 329. The linkage part 326 can be configured to support the connecting member 31. In one exemplary embodiment, the linkage part 326 may include a number of first hinge elements 327 and a number of second hinge elements 328. The first hinge elements 327 are arranged along the longitudinal direction of the hinge shaft 329. The second hinge elements 328 are arranged along the longitudinal direction of the hinge shaft 329. The first hinge elements 327 and the second hinge elements 328 are alternatively arranged along the longitudinal direction of the hinge shaft 329.

As illustrated in FIG. 13, the first hinge element 327 may include a first interior side 3271, a first exterior side 3272 and two first sidewalls 3273. The first interior side 3271 and the first exterior side 3272 are located at two opposite sides of the first hinge element 327. The two first sidewalls 3273 are located on two opposite sides of the first hinge element 327. Each of the two first sidewalls 3273 is adjacent to the first interior side 3271 and the first exterior side 3272. One of the two first sidewalls 3273 defines a shaft hole near to the first interior side 3271. The hinge shaft 329 can penetrate through the shaft hole. Thus, the hinge shaft 329 can pass through first interior side 3271 of the first hinge element 327. The first hinge element 327 can be rotated around the hinge shaft 329. The first interior side 3271 is rotatably coupled to the hinge shaft 329. In addition, the first interior side 3271 can have a curved surface. A profile of a cross-section of the curved surface is semicircle-shaped. A central axis of the semicircle-shaped profile can be overlapped with the axis of the hinge shaft 329. Thus, during rotating the first hinge element 327 and the second hinge element 328, the first hinge element 327 and the second hinge element 328 will not be interfered with each other. The first exterior side 3272 can have a similar structure so as to avoid an interference caused by the first exterior side 3272 to the other component. The first hinge element 327 can be made of metal. An anodic oxidation treatment can be applied to a surface of the first hinge element 327. Thus, the first hinge element 327 can have a good appearance. In one exemplary embodiment, the first hinge element 327 can be curved. Thus, the first hinge element 327 can provide a support to the connecting member 31.

The second hinge element 328 may include a second interior side 3281, a second exterior side 3282 and two second sidewalls 3283. The second interior side 3281 and the second exterior side 3282 are located at two opposite sides of the second hinge element 328. The two second sidewalls 3283 are located on two opposite sides of the second hinge element 328. Each of the two second sidewalls 3283 is adjacent to the second interior side 3281 and the second exterior side 3282. One of the two second sidewalls 3283 defines a shaft hole near to the second interior side 3281. The hinge shaft 329 can pass through the shaft hole. Thus, the hinge shaft 329 can penetrate through second interior side 3281 of the second hinge element 328. The second interior side 3281 is rotatably coupled to the hinge shaft 329. The second sidewall 3283 is substantially parallel to the first sidewall 3273. A gap is formed between the second sidewall 3283 and the first sidewall 3273. Thus, the second hinge element 328 can be rotated around the hinge shaft 329 with respect to the first hinge element 327 smoothly. In addition, the second interior side 3281 can have a curved surface. A profile of a cross-section of the curved surface is semicircle-shaped. A central axis of the semicircle-shaped profile can be overlapped with the axis of the second hinge shaft 329. Thus, during rotating the first hinge element 327 and the second hinge element 328, the first hinge element 327 and the second hinge element 328 will not be interfered with each other. The second exterior side 3282 can have a similar structure so as to avoiding an interference caused by the second exterior side 3282 to the other component. The second hinge element 328 can be made of metal. An anodic oxidation treatment can be applied to a surface of the second hinge element 328. Thus, the second hinge element 328 can have a good appearance.

In the present embodiment, the linkage part 326 can further include a third hinge element 333, a fourth hinge element 334, a first auxiliary hinge shaft 335 and a second auxiliary hinge shaft 336. The third hinge element 333 can be made of metal. An anodic oxidation treatment can be applied to a surface of the third hinge element 333. Thus, the third hinge element 333 and the first hinge element 327 can have identical appearance. The fourth hinge element 334 can be made of metal. An anodic oxidation treatment can be applied to a surface of the fourth hinge element 334. Thus, the fourth hinge element 334 and the first hinge element 327 can have identical appearance. The third hinge element 333 is pivotally coupled with the first exterior side 3272 of the first hinge element 327 by the first auxiliary hinge shaft 335. The fourth hinge element 334 is pivotally coupled with the second exterior side 3282 of the second hinge element 328 by the second auxiliary hinge shaft 336.

In one exemplary embodiment, the first auxiliary hinge shaft 335 is substantially parallel to the hinge shaft 329. The third hinge element 333 includes a third interior side 3331, a third exterior side 3332 and two third sidewalls 3333. The third interior side 3331 and the third exterior side 3332 are located at two opposite sides of the third hinge element 333. The two third sidewalls 3333 are located on two opposite sides of the third hinge element 333. Each of the two third sidewalls 3333 is adjacent to the third interior side 3331 and the third exterior side 3332. One of the two third sidewalls 3333 defines a shaft hole near to the third interior side 3331. The first auxiliary hinge shaft 335 can pass through the shaft hole. The third hinge element 333 can be rotated around the first auxiliary hinge shaft 335. That is, the third hinge element 333 is hinged with the first hinge element 327 by the first auxiliary hinge shaft 335. In addition, the first auxiliary hinge shaft 335 can pass through the shaft hole formed in the first exterior side 3272 of the first hinge element 327. Thus, the third coupling member 333 is hinged with the first hinge element 327 by the first auxiliary hinge shaft 335. The third coupling member 333 can be rotated relative to the first hinge element 327. In one exemplary embodiment, the linkage part 326 can further include a number of third hinge elements 333 and a number of first hinge elements 327. The third hinge elements 333 and the first hinge elements 327 are arranged alternatively along the first auxiliary hinge shaft 335.

Additionally, one of the two third sidewalls 3333 of the third hinge element 333 may have a first extending portion 3334. An extending direction of the first extending portion 3334 is substantially parallel to the first auxiliary hinge shaft 335. An extending length is substantially equal to a distance of the two first sidewalls 3273 of the two adjacent first hinge elements 327 along the first auxiliary hinge shaft 335. The first extending portion 3334 of one of the two adjacent third hinge elements 333 along the first auxiliary hinge shaft 335 is in contact with the third sidewall 3333 of the other of the two adjacent third hinge elements 333 along the first auxiliary hinge shaft 335. Thus, a contact area of the linkage part 326 and the connecting member 31 can be increased. The performance of the linkage part 326 for supporting the connecting member 31 can be improved.

The first connection part 3211 is coupled to the first hinge element 327 by the third hinge element 333. The first connection part 3211 (as illustrated in FIG. 12) of the coupling member 32 may include a number of third exterior sides 3332 of the third hinge elements 333. The first sliding plate 3213 is coupled to the third exterior sides 3332 of the third hinge elements 333. The first sliding plate 3213 can be integrated with the corresponding third hinge element 333.

The third exterior side 3332 has a side surface. For example, the side surface is a plane. The first sliding plate 3213 is substantially perpendicular to the side surface of the third exterior side 3332. And then, the third hinge elements 333 can be slidably coupled to the first housing 10 by the first sliding plate 3213. Thus, the first connection part 3211 of the coupling member 32 can be slidably coupled to the first housing 10.

In one exemplary embodiment, the third sidewall 3333 of the third hinge element 333 can be substantially parallel to the first sidewall 3273 of the first hinge element 327. A gap can be formed between the third sidewall 3333 of the third hinge element 333 and the first sidewall 3273 of the first hinge element 327 adjacent to the third hinge element 333 along the first auxiliary hinge shaft 335. Thus, the first hinge element 327 can be rotated relative to the third hinge element 333 smoothly. In addition, the third interior side 3331 can be have a curved surface. A profile of a cross-section of the curved surface is semicircle-shaped. A central axis of the semicircle-shaped profile can be overlapped with the axis of the first auxiliary hinge shaft 335. Thus, during rotating the third hinge element 333 and the first hinge element 327, the first hinge element 327 and the third hinge element 333 will not be interfered with each other. Moreover, the first extending portion 3334 may have a curved surface facing the first hinge element 327. A profile of a cross-section of the curved surface can be semicircle-shaped.

The fourth hinge element 334 is similar to the third hinge element 333. When the coupling member 32 is assembled, a second extending portion 3344 of the fourth hinge element 334 and the first extending portion 3334 of the third hinge element 333 extend in two opposite directions. The fourth hinge element 334 and the second hinge element 328 are alternatively arranged along the second auxiliary hinge shaft 336. The second connection part 3212 (as illustrated in FIG. 12) of the coupling member 32 may include a number of third exterior sides 3342 of the fourth hinge elements 334. Thus, the second connection part 3212 of the coupling member 32 can be slidably coupled to the second housing 20 by the second sliding plate 3215.

Figure 14:
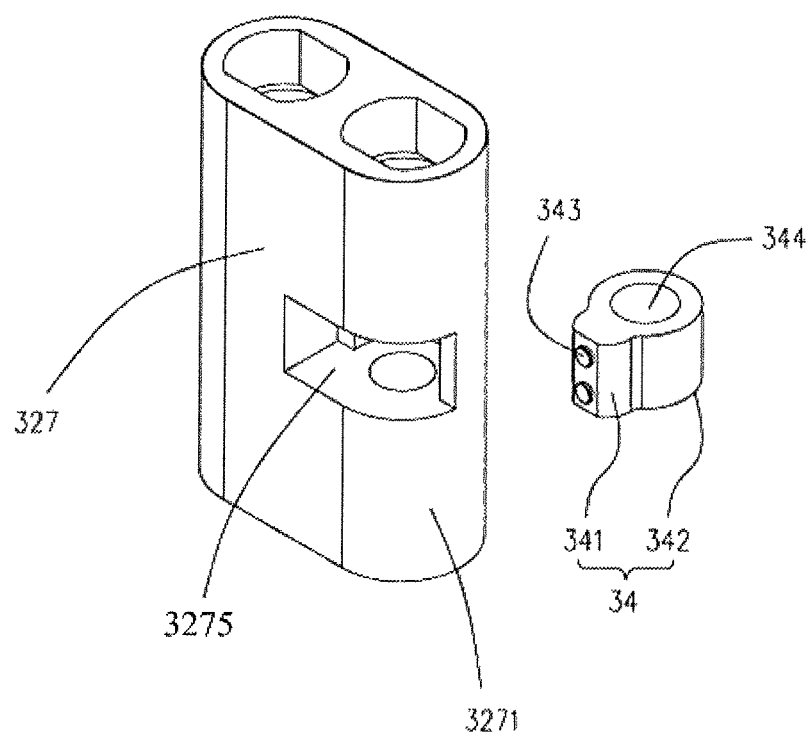
FIG. 14 illustrates an exploded view of a first hinge element and a positioning member of the coupling member shown in FIG. 12.
Figure 15:
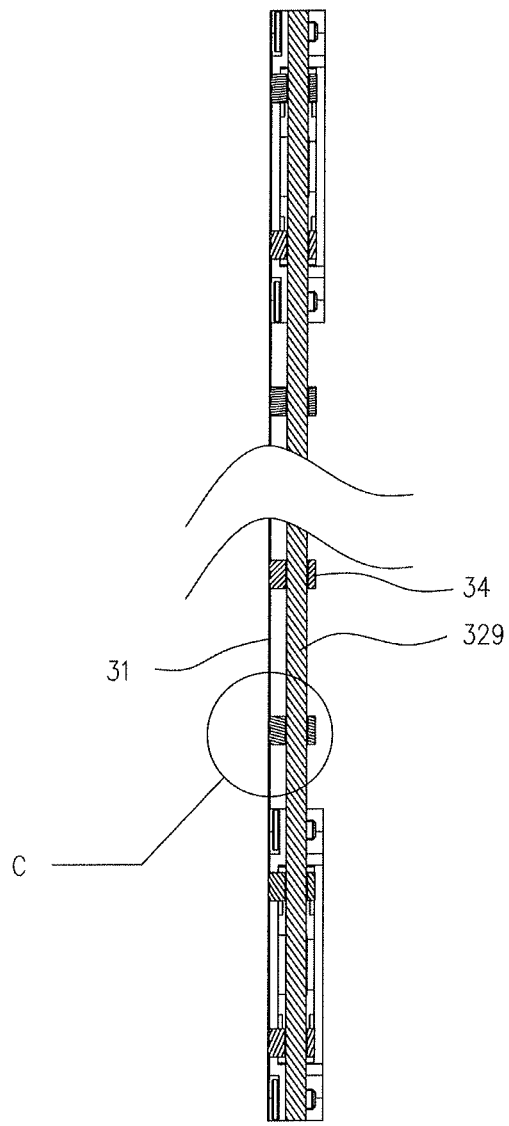
FIG. 15 illustrates a cross-sectional schematic view of a connecting member, a hinge shaft and a positioning member of the coupling member as shown in FIG. 12.
Figure 16:
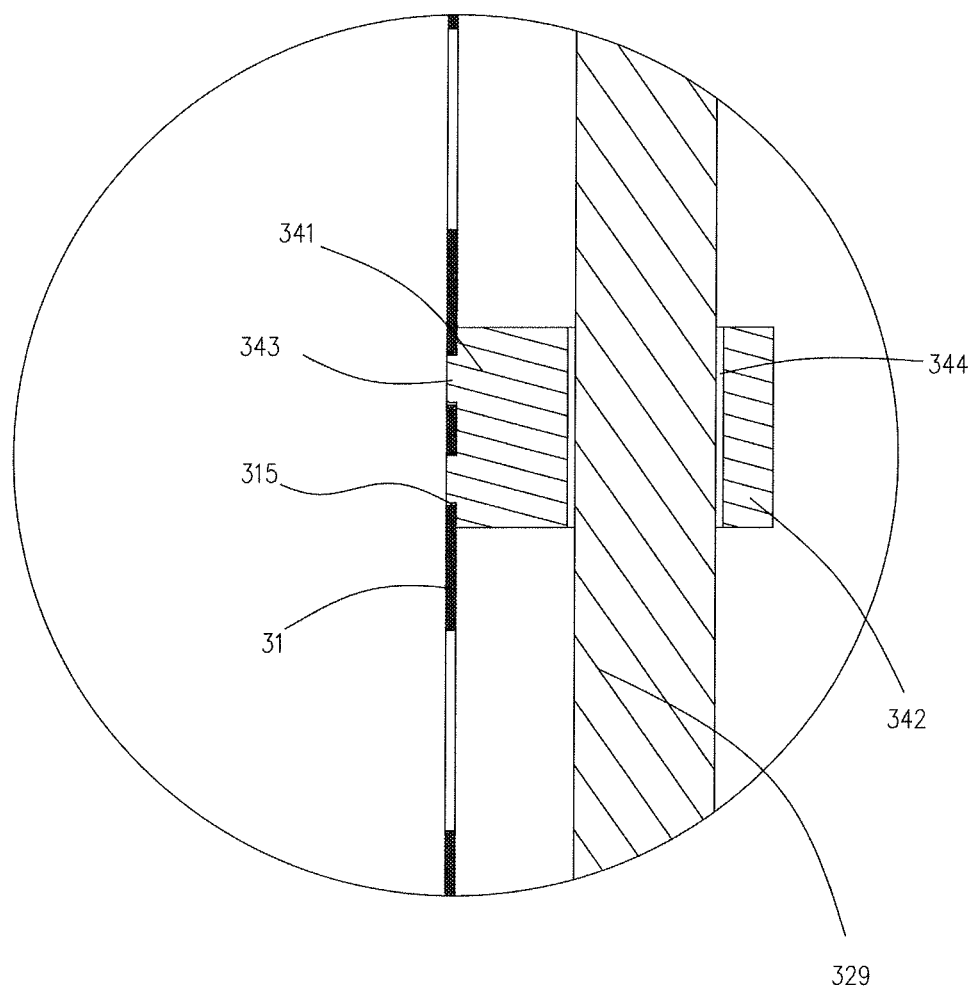
FIG. 16 illustrates an enlarged view of part C in FIG. 15.
Figure 17:
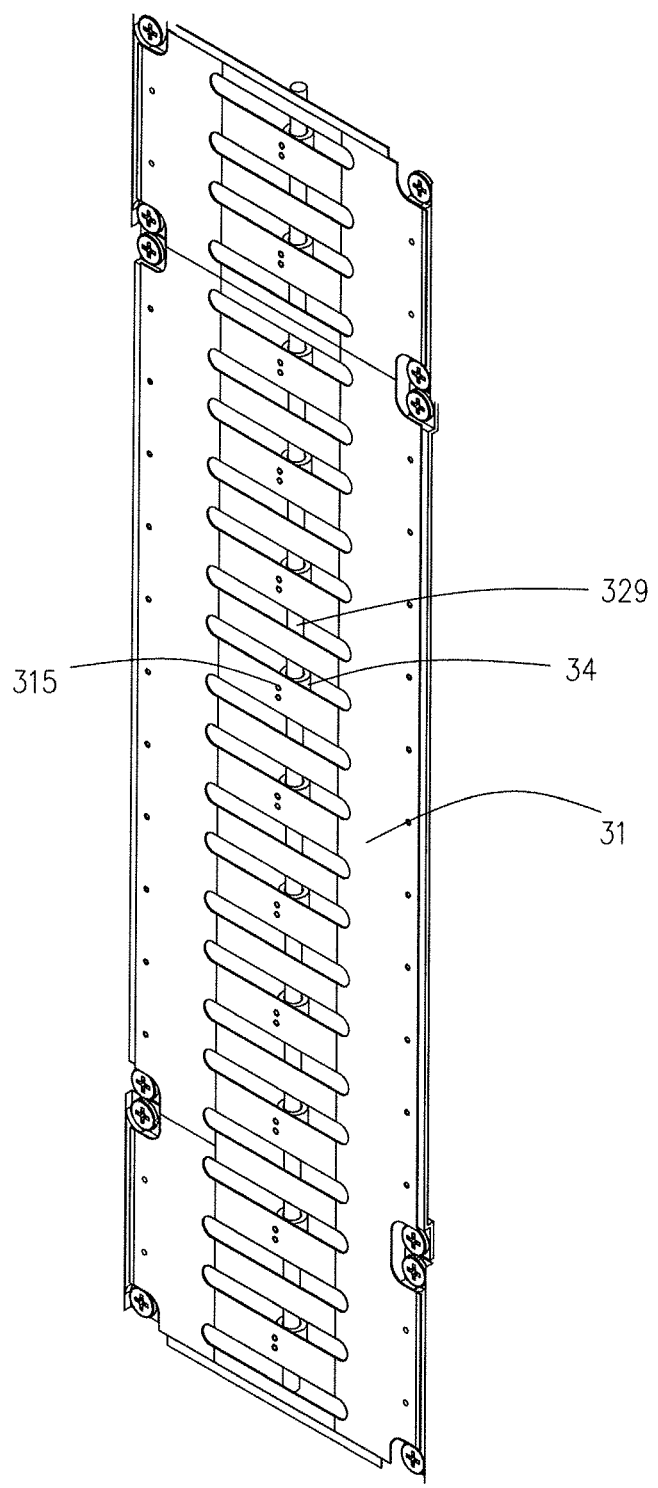
FIG. 17 illustrates an assembled view of a connecting member, a hinge shaft and a positioning member.

The first connection part 3211 of the coupling member 32 is slidably coupled to the first housing 10 and the second connection part 3212 of the coupling member 32 is slidably coupled to the second housing 20. The coupling member 32 is coupled to the connecting member 31. Thus, the coupling member 32 is prevented from sliding along a direction perpendicular to the hinge shaft 329 with respect to the connecting member 31. That is, the coupling member 32 and the connecting member 31 may be slide either from the first interior portion 14 to the first exterior portion 15 together or from the first exterior portion 15 to the first interior portion 14 together. Thus, the coupling member 32 can support the connecting member 31 effectively. As illustrated in FIG. 14, the connecting module 30 further includes a positioning member 34. In one exemplary embodiment, the positioning member 34 includes a first end 341 and a second end 342 opposite the first end 341. The first end 341 is coupled to the connecting member 31, and the second end 344 is coupled to the coupling member 32. The positioning member 34 is configured to prevent the coupling member 32 from moving to the first housing 10 or the second housing 20 with respect to the connecting member 31. In one embodiment, the first end 341 is coupled to the connecting member 31, and the second end 342 is configured to prevent the coupling member 32 from moving with respect to the connecting member 31. A distance of the positioning member 34 and the first housing 10 is substantially equal to a distance of the positioning member 34 and the second housing 20. The coupling member 32 is coupled to the connecting member 31 by the positioning member 34. Thus, the coupling member 32 will not move towards the first housing 10 or the second housing 20 relative to the connecting member 31.

As illustrated in FIG. 14, FIG. 15, FIG. 16 and FIG. 17, in an exemplary embodiment, the first end 341 includes a raised portion 343. The raised portion 343 is raised far away from the second end 342. The second end 342 have a through hole 344. A central axis of through hole 344 is substantially perpendicular to a raising direction of the raised portion 343. The central axis of through hole 344 is substantially parallel to the hinge shaft 329. In addition, the connecting member 31 defines a number of welding holes 315. The raised portion 343 of the positioning member 34 of the first hinge element 327 can be received in the welding hole 315 and welded to the connecting member 31. The first interior side 3271 of the first hinge element 327 have a cutout 3275 facing the connecting member 31. The second end 342 of the positioning member 34 is received in the cutout 3275. The hinge shaft 329 may pass through the through hole 344 and the cutout 3275. The second end 342 is coupled to the hinge shaft 329. That is, the positioning member 34 will not be rotated around the hinge shaft 329. Thus, the positioning member 342 can be rotated with respect to the first hinge element 327 by rotating the hinge shaft 329 in the cutout 3275. The longitudinal geometric central line of the connecting member 31 may be substantially parallel to and overlapped with the longitudinal geometric central line of the coupling member 32. The coupling member 32 will not move towards the first housing 10 or the second housing 20 relative to the connecting member 31. The coupling member 32 can provide a support to the connecting member 31 effectively. The connecting module 30 can provide a support to the flexible display panel 40 effectively. In one embodiment, the connecting member 31 may define a number of welding holes 315. Each of the welding holes 315 faces one first hinge element 327. It is noted that, the connecting member 31 may define a number of welding holes 315 facing the second hinge element 328. Correspondingly, the second hinge element 328 can define a cutout 3275. The connecting module 34 may include a number of positioning members 34.

Figure 18:
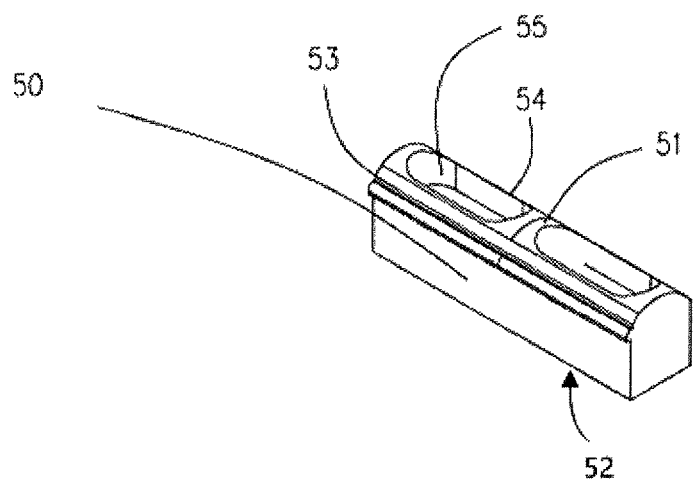
FIG. 18 illustrates a schematic view of the capping member of the housing assembly shown in FIG. 1.
Figure 19:
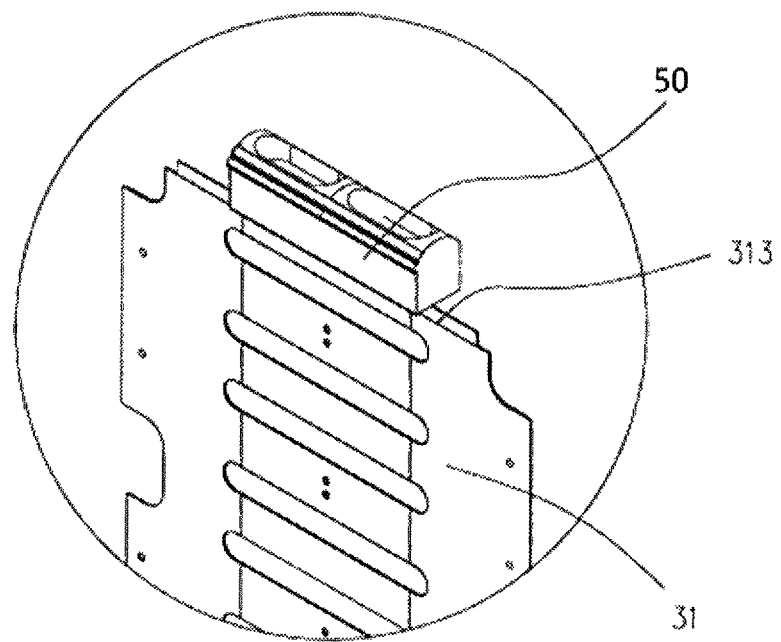
FIG. 19 illustrates a cross-sectional schematic view of a housing assembly, in accordance with further another embodiment of the present disclosure.

As illustrated in FIG. 18 and FIG. 19, in one embodiment, the two capping members 50 are respectively disposed at the first connecting side 313 and the second connecting side 313' of the connecting member 31. In other words, the two capping members 50 are respectively disposed at two sides of the flexible display panel 40. Each of two the capping members 50 is coupled to a side of the flexible display panel 40. Thus, the first connecting side 313 and the second connecting side 313' of the connecting member 31 can be covered by the capping member 50, and the side of the flexible display panel 40 can also be covered by the capping member 50. One end of each of the capping members 50 is in contact with the first housing 10, the other end is in contact with the second housing 20. The capping member 50 may have a first side wall 53 and a second side wall 54 opposite to the first side wall 53. The first side wall 53 is substantially parallel to the second side wall 54. The first side wall 53 is also parallel to the first connecting side 313 and the second connecting side 313' of the connecting member 31 (i.e., parallel to a side of the flexible display panel 40). The first side wall 53 is coupled to the side of the flexible display panel 40 and is configured to cover the first connecting side 313 (or the second connecting side 313') and the side of the flexible display panel 40.

Each of the capping members 50 includes an outer surface 51 and an inner mounting surface 52 opposite to the outer surface 51. The inner mounting surface 52 is located between the first side wall 53 and the second side wall 54, and the outer surface 51 is also located between the first side wall 53 and the second side wall 54. The outer surface 51 can be a caved surface protruding away from the inner mounting surface 52. The inner mounting surface 52 can be configured to be in contact with the hinge shaft 329. The outer surface 51 defines a number of holes 55. That is, the holes 55 extend through the outer surface 51. The holes 55 may further extend through the inner mounting surface 52. The holes 55 are located between the first side wall 53 and the second side wall 54. An arrangement direction of the holes 55 is substantially parallel to a longitudinal direction of the first side wall 53. A cross-sectional configuration of each of the holes 55 can be stripe-shaped, and a longitudinal direction of each of the holes 55 is parallel to the longitudinal direction of the first side wall 53. The capping member 50 can be bent together with the first connecting side 313, the second connecting side 313' and the side of the flexible display panel 40. That is, the holes 55 can provide a space for the bent first side wall 53 and the bent second side wall 54. Then, a configuration of each of the holes 55 will be changed during bending the first side wall 53 and the second side wall 54. The capping member 50 with the holes 55 can have an excellent flexibility. The capping member 50 can be made of a flexible material. A configuration of each of the holes 55 can be circle, or rectangular, etc.

Figure 20:
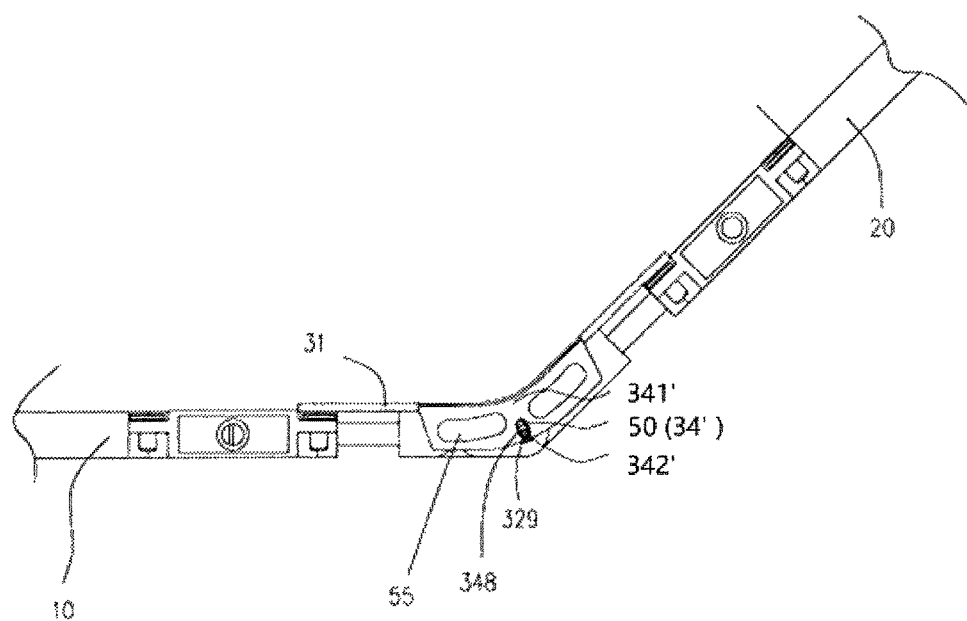
FIG. 20 illustrates a partial schematic view of a connecting member and the capping member shown in FIG. 18.

It is noted that, the capping member 50 in the present embodiment can also be used as a position member 34'. As illustrated in FIG. 18 and FIG. 20, the first side wall 53 can be configured to be the first end 341' of the position member 34', the second side wall 54 can be configured to be the second end of the position member 34'. A positioning groove 348 is defined in the capping member 50 (i.e., the position member 34'). The positioning groove 348 can extend through the inner mounting surface 52 and the outer surface 51 of the capping member 50. The positioning groove 348 can be runway-shaped. In other words, the positioning groove 348 is substantially striped-shaped. Each of two ends of the positioning groove 348 has a profile of semicircle-shaped. A longitudinal direction of the positioning groove 348 is substantially perpendicular to the first side wall 53 and the second side wall 54. A longitudinal geometric central line of the positioning groove 348 and the geometric central line of the connecting member 31 are coplanar. One end of the hinge shaft 329 is slidably positioned in the positioning groove 348. Thus, the hinge shaft 329 can slide from one end of the positioning groove 348 to the other end of the positioning groove 348. The coupling member 32 can slide either close to the connecting member 31 or far away from the connecting member 31. Meanwhile, the coupling member 32 can be prevented from moving towards the first housing 10 and the second housing 20 with respect to the connecting member 31.

Figure 21:
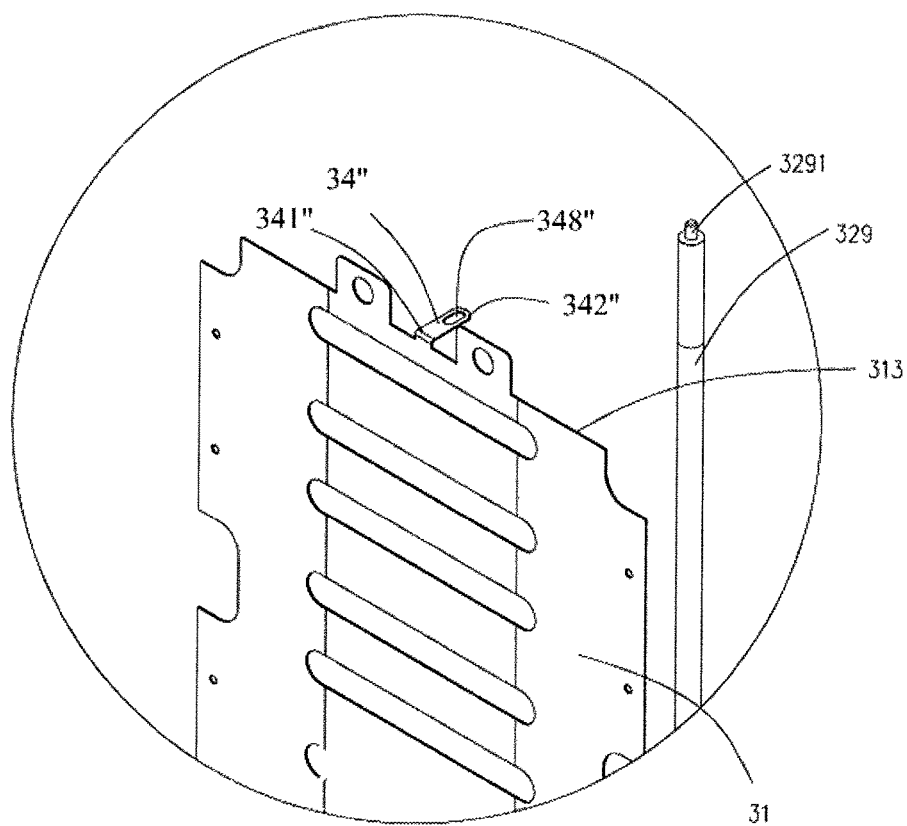
FIG. 21 illustrates a cross-sectional schematic view of a connecting member, a hinge shaft and a positioning member.
Figure 22:
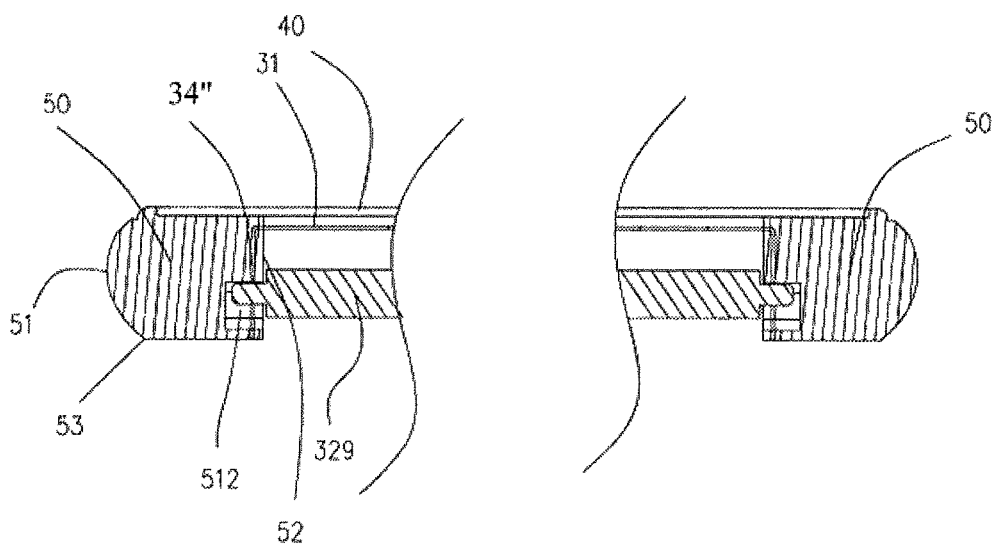
FIG. 22 illustrates a schematic view of a first housing, a second housing, a connecting member, and a positioning member.

As illustrated in FIG. 21 and FIG. 22, in another exemplary embodiment, a positioning member 34" is provided. The positioning member 34" can be a connection plate. The positioning member 34" is integrated with the connecting member 31. That is, the positioning member 34" is extended from the end (i.e., the first connecting side 313) of the connecting member 31. The connection plate is rigid. The positioning member 34" is substantially located at the geometric central line of the connecting member 31. The positioning member 34' includes a first end 341" and a second end 342" opposite to the first end 341". The first end 341" of the positioning member 34" is fixed to the connecting member 31. A distance of the first end 341" and the first housing 10 is substantially to the first end 341" and the second housing 20. The second end 342" is far away from the connecting member 31. The positioning member 34" is substantially perpendicular to the connecting member 31. For example, the connecting member 31 with the positioning member 34" can be made of a metal plate by a punching process. Thus, two ends of the metal plate can be bent to form the two positioning members 34" coupled to the connecting member 31. The second end 342" of the positioning member 34" may define a positioning groove 348". The positioning groove 348" extends towards a first end 341". The coupling member 32 is coupled to the positioning member 34". The hinge shaft 329 of the coupling member 32 is slidably positioned in the positioning groove 348". The hinge shaft 329 includes two sliding rods 3291. The two sliding rods 3291 are respectively located at two ends of the hinge shaft 329. The sliding rod 3291 at one end of the hinge shaft 329 is slidably coupled to the positioning groove 348" of one positioning member 34", the sliding rod 3291 at the other end of the hinge shaft 329 is slidably coupled to the positioning groove 348" of the other positioning members 34". Thus, the first coupling member 329 can slide along the longitudinal direction of the positioning groove 348". Thus, the hinge shaft 329 can slide from one end of the positioning groove 348" to the other end of the positioning groove 348". The coupling member 32 can slide either close to the connecting member 31 or far away from the connecting member 31. A distance of the coupling member 32 and the connecting member 31 can be changed in a predetermined range. When the rotating angel of the first housing 10 with respect to the second housing is more than 180°, the distance of the connecting member 31 and the coupling member 32 will be increased. At this time, the hinge shaft 329 may slide towards the second end 342" of the positioning groove 348" far away the first end 341". Thus, the positioning groove 348" can be configured to guide the hinge shaft 329 and prevent the hinge shaft 329 from sliding out of the positioning member 34".

Figure 23:
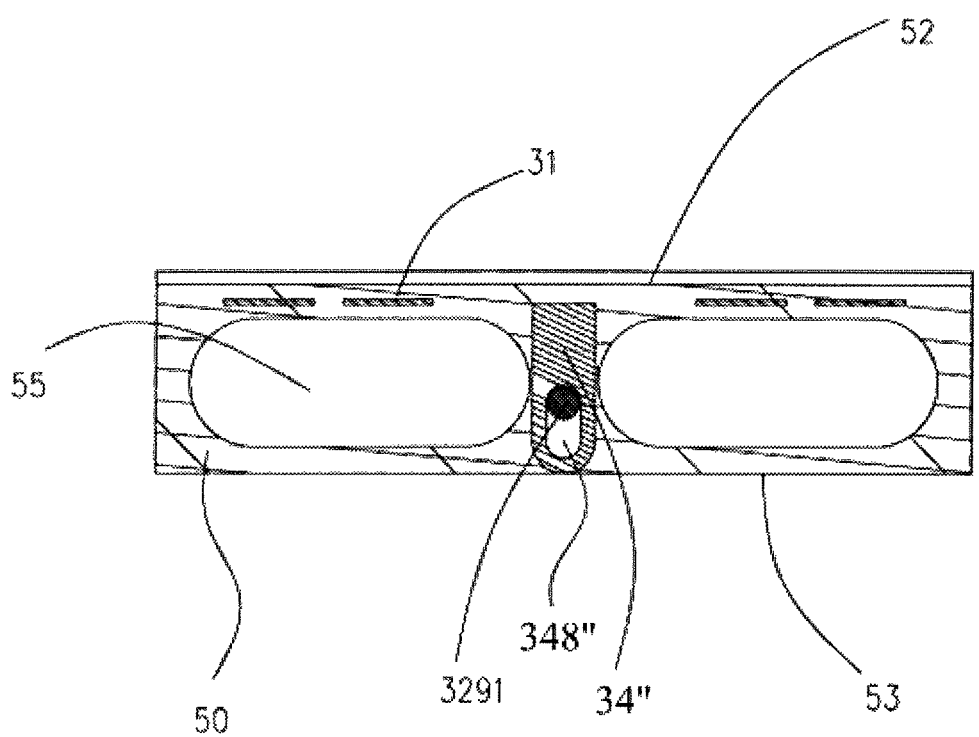
FIG. 23 illustrates a cross-sectional schematic view of a connecting member, a hinge shaft and a positioning member.

Correspondingly, as illustrated in FIG. 22 and FIG. 23, the inner mounting surface 52 of the capping member 50 can be configured to be coupled to the positioning member 34". The inner mounting surface 52 may further define a sliding groove 512 communicated with the positioning groove 348" of the positioning member 34". The sliding rod 3291 of the first hinge shaft 329 can pass through the positioning groove 348" into the sliding groove 512. Thus, the sliding rod 3291 can also slide in the sliding groove 512.

The capping member 50 can be configured to cover the two ends of the connecting module 30. Meanwhile, the positioning members 34" can be configured to prevent the coupling member 32 from moving towards the first housing 10 or the second housing 20 with respect to the connecting member 31. Each of the capping member 50 can be flexible. The inner mounting surface 52 is coupled to the first connecting side 313 or the second connecting side 313' of the connecting member 31 by means of adhesive or other suitable connections. The capping member 50 can be bent together with the first connecting side 313 or the second connecting side 313' of the connecting member 31.

Figure 24:
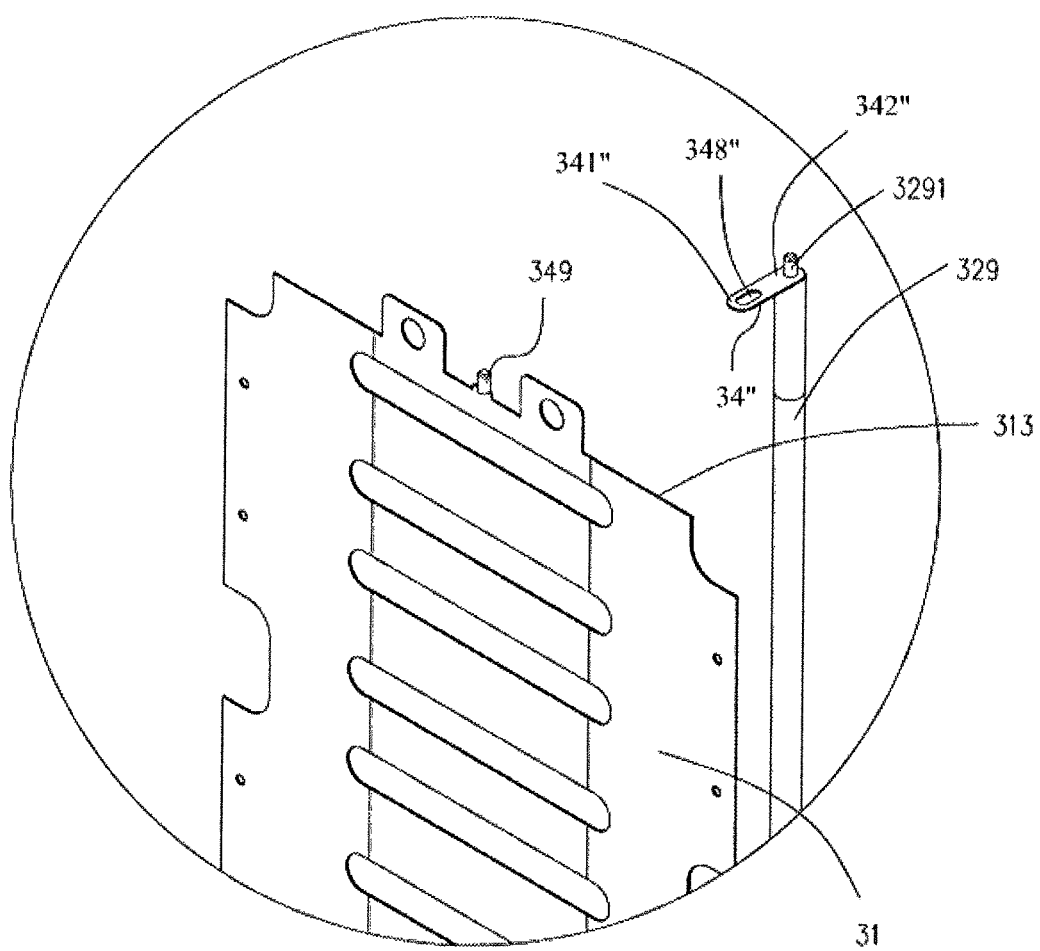
FIG. 24 illustrates a partial schematic view of a connecting member and a positioning member, in accordance with further another embodiment of the present disclosure.

In an exemplary embodiment, as illustrated in FIG. 24, the second end 342" of the positioning member 34" can be fixed to the end of the hinge shaft 329 of the coupling member 32. The first end 341" of the positioning member 34" defines a positioning groove 348". The positioning groove 348" can be runway-shaped. A sliding rod 349 is disposed at the first connecting side 313 of the connecting member 31. It is noted that, another sliding rod 349 can be disposed at the second connecting side 313' of the connecting member 31. An axis of the sliding rod 349 is overlapped with a longitudinal geometric central line of the connecting member 31. The sliding rod 349 is slidably coupled to the positioning groove 348" of the positioning members 34". Thus, the first coupling member 329 can slide along a longitudinal direction of the positioning groove 348". The longitudinal direction of the positioning groove 348" is substantially perpendicular to the longitudinal direction of the connecting member 31. The longitudinal geometric central line of the connecting member 31 and a longitudinal geometric central line of the positioning groove 348" are coplanar. The coupling member 32 can be prevented from moving towards the first housing 10 or the second housing 20 relative to the connecting member 31.

The sides of the connecting module 30 for supporting the flexible display panel 40 can be covered by the capping members 50. Thus, the housing assembly 100 can have a good appearance. In one exemplary embodiment, the capping member 50 can be made of silicone. The capping member 50 can be integrated with the connecting member 31 by a molding process. In other embodiment, the capping member 50 can be coupled to the connecting member 31 by means of screw.

The housing assembly 100 is configured for carrying the flexible display panel 40, and accommodating an electronic component group 300. The first housing 10 is configured for supporting the first portion 41 of the flexible display panel 40. The second housing 20 is configured for supporting the second display portion of the flexible display panel 40. The connection module 30 can be folded or unfolded, and is configured for supporting the third portion 43 of the flexible display panel 40.

Figure 25:
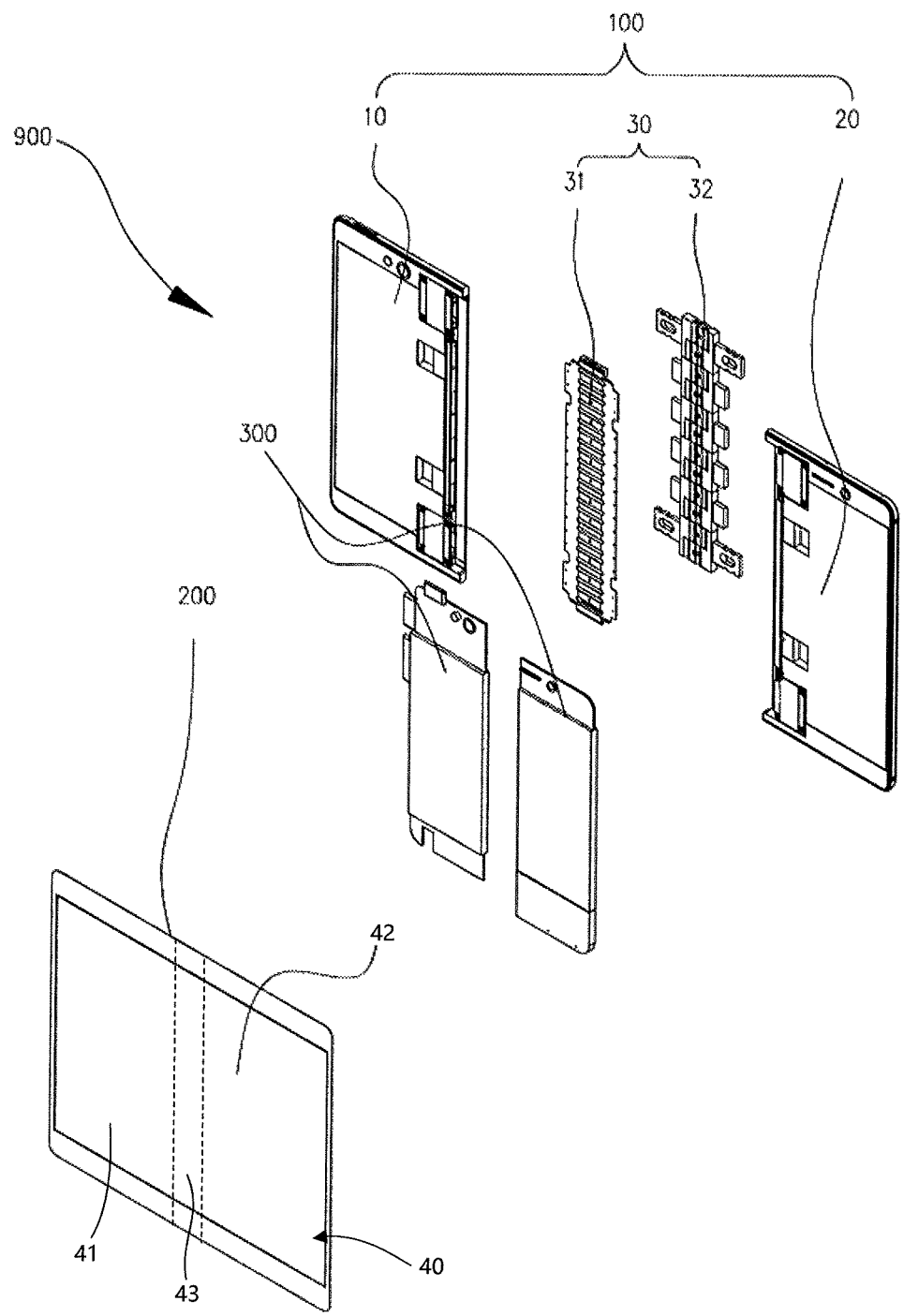
FIG. 25 illustrates an exploded view of an electronic device, in accordance with an embodiment of the present disclosure.
Figure 26:
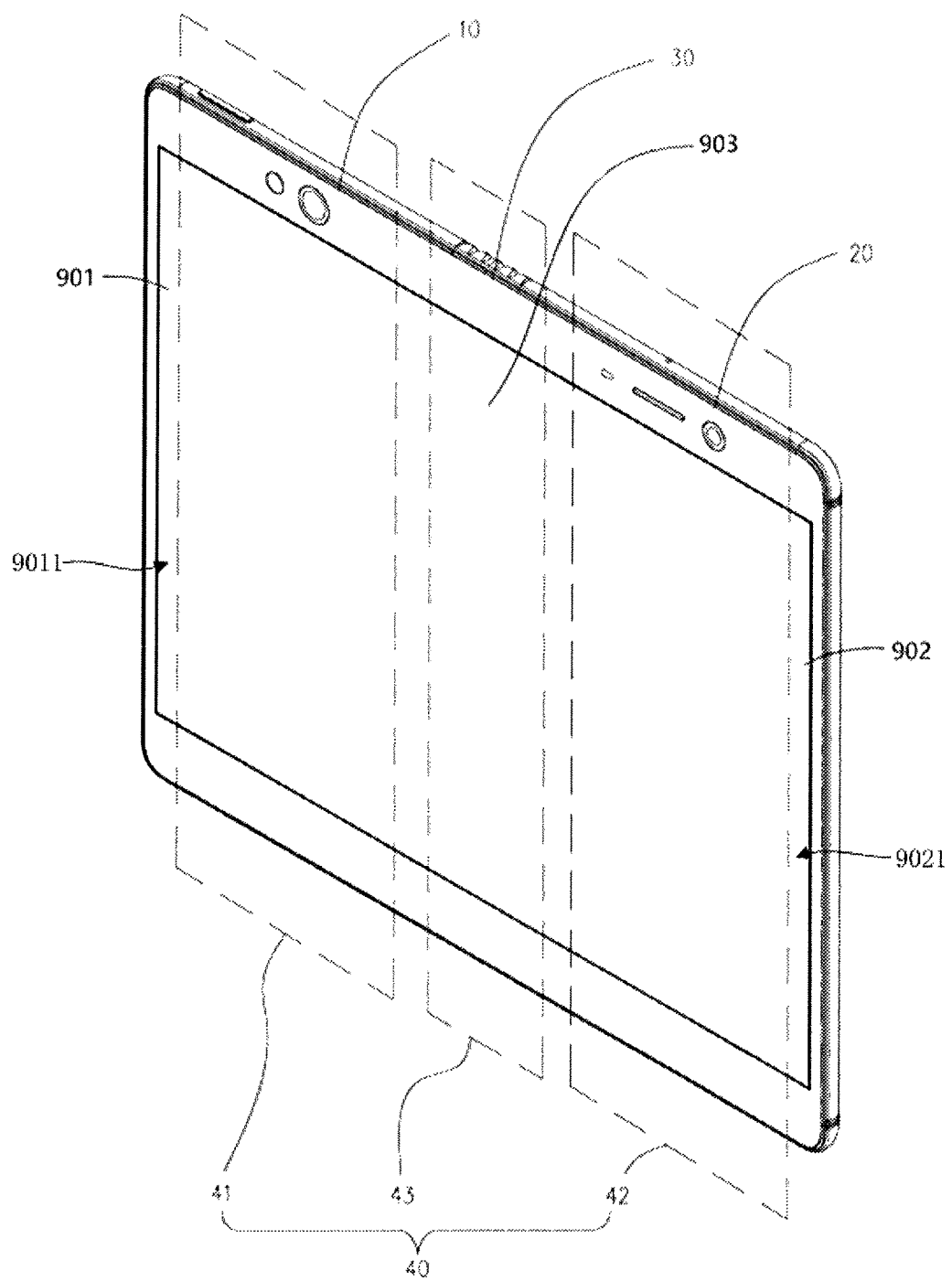
FIG. 26 illustrates a schematic view of the electronic device shown in FIG. 25 in an unfolded configuration.

As illustrated in FIG. 25 and FIG. 26, in the present embodiment, the flexible display panel 40 includes a first portion 41, a second portion 42 and a bendable portion 43 between the first portion 41 and the second portion 42. The first portion 41 is attached to the first supporting surface 111, the second display portion is attached to the second supporting surface 121. The first portion 41 can move with the first housing 10, and the second portion 42 can move with the second housing 20. Thus, the mobile terminal 900 may include a first display portion 901, a second display portion 902 and a bending display portion 903. The first display portion 901 is equipped with the first portion 41, the second display portion 902 is equipped with the second portion 42, and the bending display portion 903 is equipped with the third portion 43. The first display portion 901 includes a first display surface and a first rear surface 121 (i.e., the first rear surface 121 of the first housing 10, see FIG. 3). It is noted that, the first display surface 9011 and the second display surface 9021 are parts of a display surface of the flexible display panel 40. The first display surface 9011 of the first portion 41 can be positioned on the first housing 10, the second display surface 9021 of the second portion 42 can be positioned on the second housing 20. The second display portion 902 includes a second display surface and a second rear surface 121 (i.e., the second rear surface 221 of the first housing 20, see FIG. 3). The mobile terminal 900 can be either in a folded configuration, an angular configuration or in an unfolded mold. In the folded configuration, as illustrated in FIG. 45, the second display portion 902 can be rotated relative to the first display portion 901, and then can be stacked onto the first display portion 901. The first rear surface 121 of the first display portion 901 is in attached to the second rear surface 221 of the second display portion 902. Meanwhile, the protruding portion 122 of the first display portion 901 is received in the indentation 222 (see FIG. 26). By rotation of the first housing 10 relative to the second housing 20, the flexible display panel 40 can be transitionable between: (i) a first configuration (i.e., the unfolded configuration) in which the first display surface 9011 is coplanar with the second display surface 9021, and (ii) a second configuration (i.e., the folded configuration or the angular configuration) in which the first display surface 9011 is noncoplanar with the second display surface 9021. For example, in the second configuration, the first display surface 9011 is angled to or parallel to the second display surface 9021.

Figure 27:
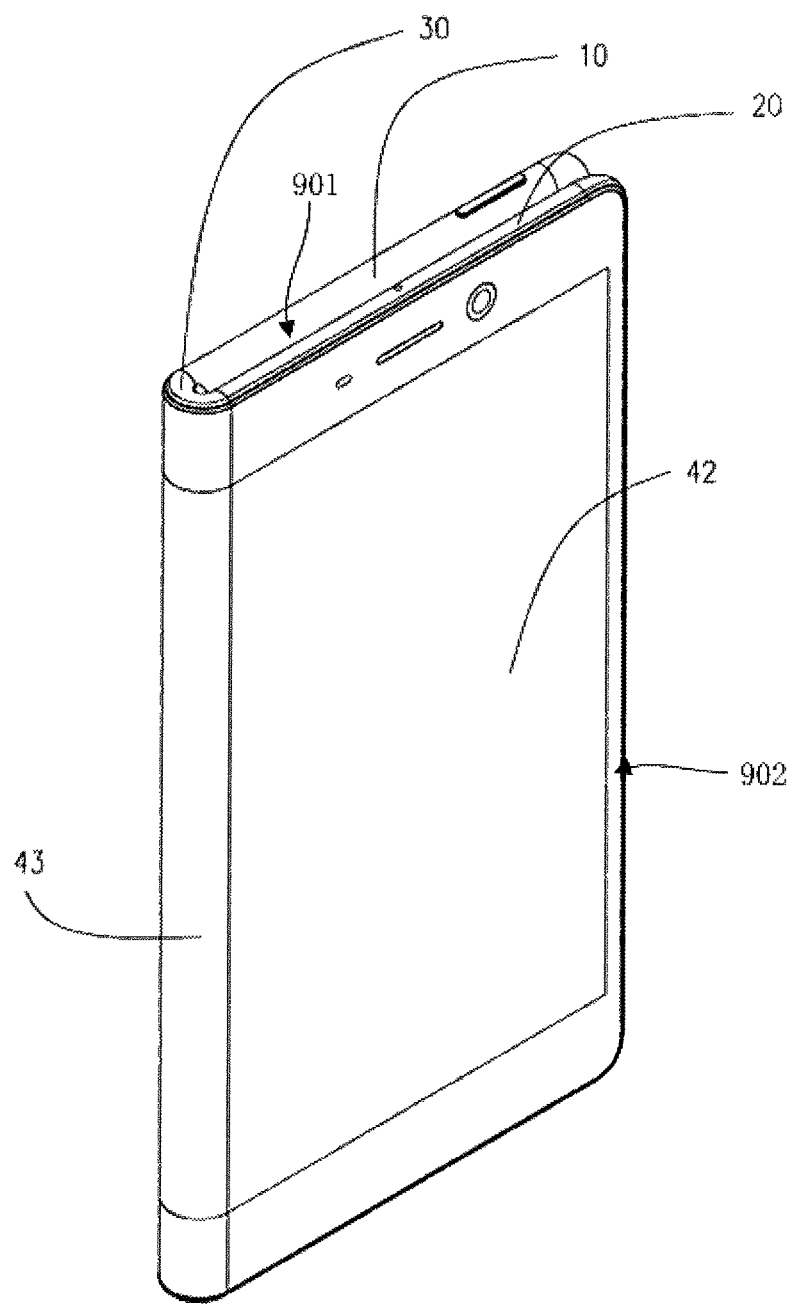
FIG. 27 illustrates a schematic view of the electronic device shown in FIG. 25 in a folded configuration.
Figure 28:
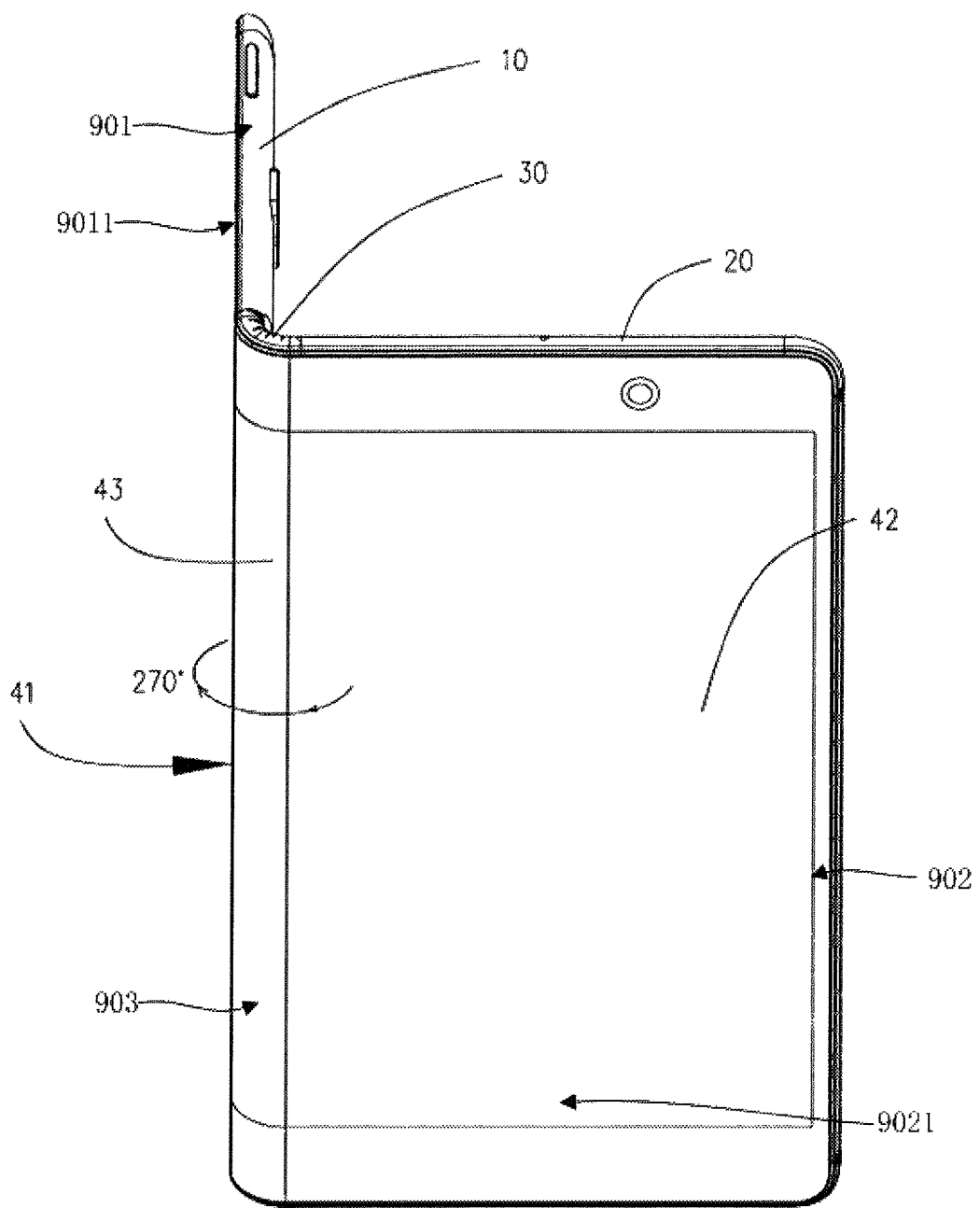
FIG. 28 illustrates a schematic view of the electronic device shown in FIG. 25 in an angular configuration.
Figure 29:
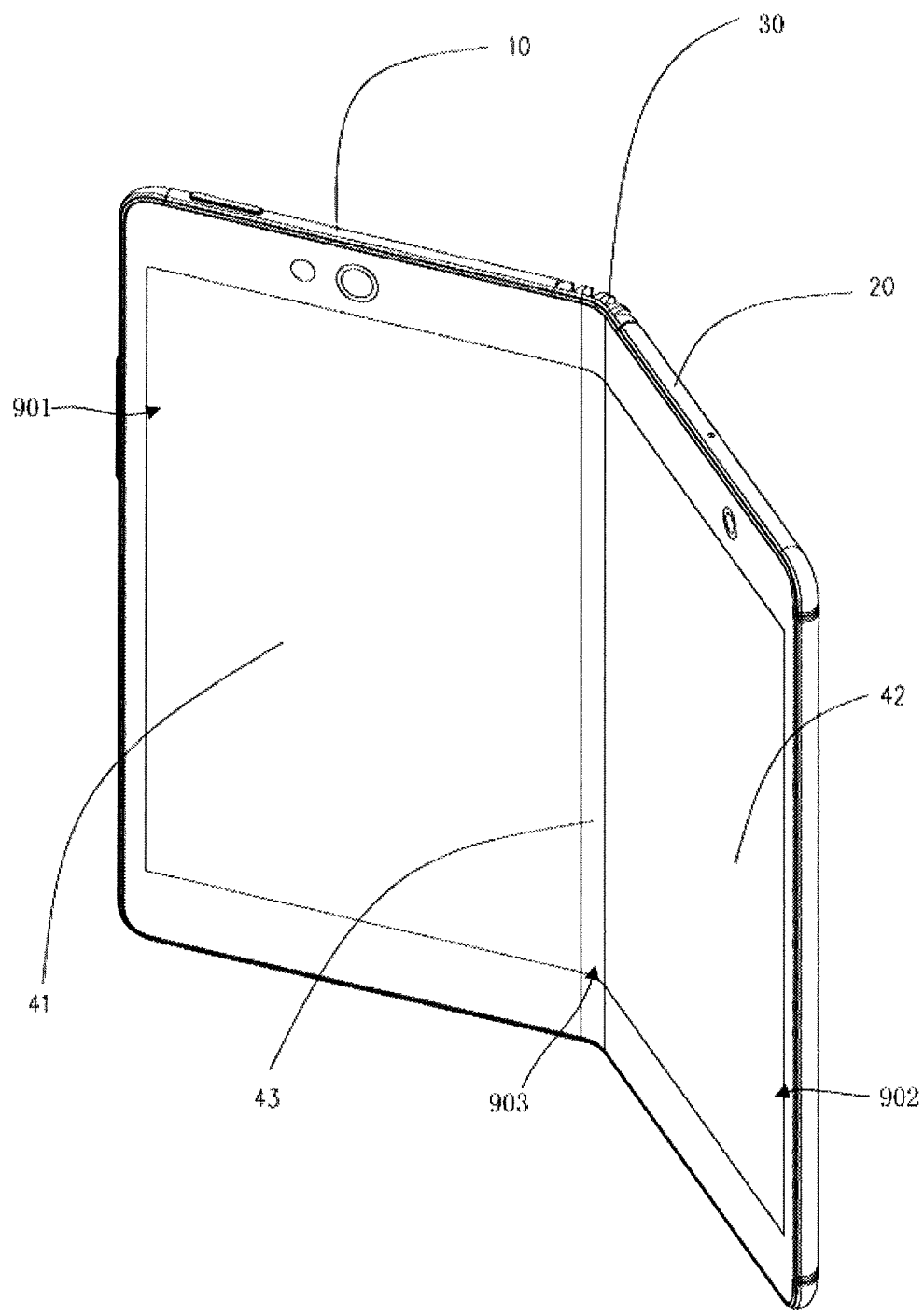
FIG. 29 illustrates a schematic view of an electronic device shown in FIG. 25 in another angular configuration in accordance with another embodiment of the present disclosure.

As illustrated in FIG. 26, the mobile terminal 900 in the unfolded configuration can be used with a large display area. For example, the first housing 10 and the second housing 20 are arranged in a plane (i.e., the first display portion 901 and the second display portion 902 are arranged in a plane), the mobile terminal 900 can be used as a tablet computer. The mobile terminal 900 can provide a large display area to the user, thereby improving the user's experience. As illustrated in FIG. 27, the mobile terminal 900 in the folded configuration can be used with a small display area. For example, the first housing 10 is stacked on the second housing 20 (i.e., the first display portion 901 is stacked on the second display portion 902). Thus, the mobile terminal 900 can be used as a mobile phone. It is convenient for a user to carry the mobile terminal 900 in the folded configuration. As illustrated in FIG. 28 and FIG. 29, the mobile terminal 900 in the angular configuration can be used with a bent display area. The angle of the first housing 10 and the second housing 20 is formed. The rotating angle of the first housing 10 with respect to the second housing 20 can be more than 180° (the rotating angle illustrated in FIG. 28 is) 270°. The rotating angle of the first housing 10 with respect to the second housing 20 can be in a range from 0 to 180° (the rotating angle illustrated in FIG. 29 is about 120°). Thus, the mobile terminal 900 can be used as a notebook computer.

Figure 30:
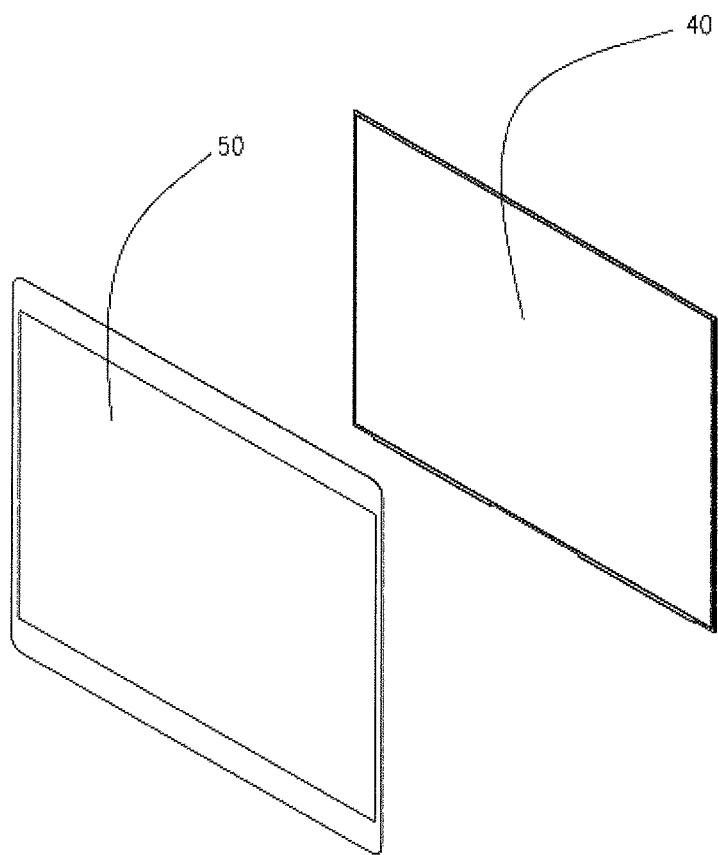
FIG. 30 illustrates an exploded view of a flexible display panel of the electronic device.

As illustrated in FIG. 30, the mobile terminal 900 further includes a flexible transparent cover 60 covering on the flexible display panel 40. The flexible transparent cover 60 is attached on the flexible display panel 40. A periphery of the flexible transparent cover 60 is coupled to the first housing 10, the second housing 20 and the connecting member 31. The flexible transparent cover 60 is configured to protect the flexible display panel 40.

Figure 31:
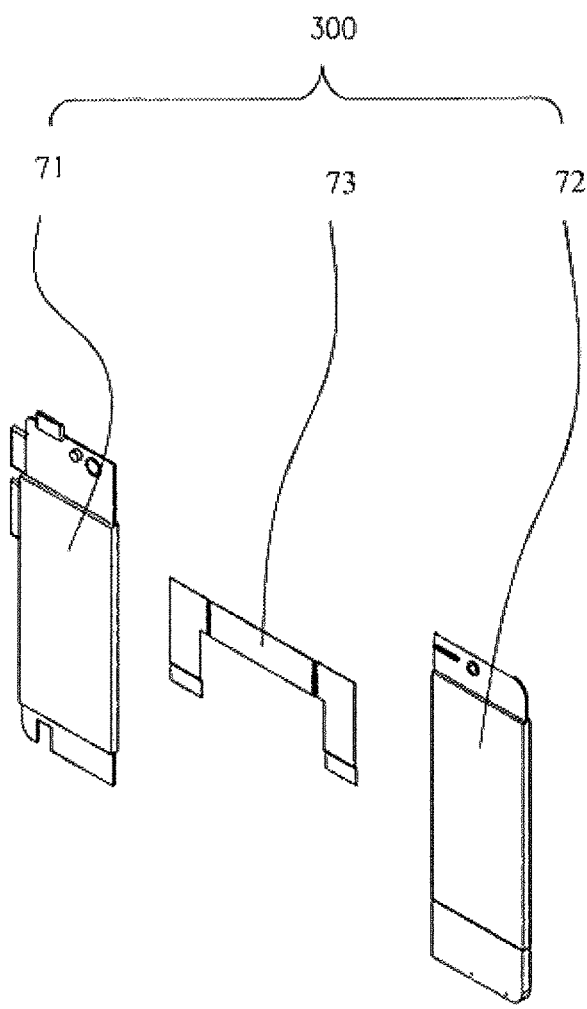
FIG. 31 illustrates an exploded view of an electronic component group.

As illustrated in FIG. 31, in the present embodiment, the electronic component 300 may include a first electronic module 71, a second electronic module 72 and a flexible circuit board 73. The first electronic module 71 is electrically coupled to the second electronic module 72 by the flexible circuit board 73. The first electronic module 71 is received in the first accommodating cavity 13, and the second electronic module 72 is received in the second accommodating cavity 23. The first electronic module 71 may include a printed circuit board and a number of functional components disposed on the printed circuit board. For example, the electronic module 71 can include a main board, a central processor, a memory, an antenna, a camera, and a receiver, etc. The second electronic module 72 may include a printed circuit board and a number of functional components disposed on the printed circuit board. The second electronic module 72 can be different from the first electronic module 71. For example, the second electronic module 72 can include a battery, a connector, finger print module, etc.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A capping member, which is adapted to a flexible display panel, wherein the flexible display panel is supported by a connecting member and a coupling member, the coupling member faces the connecting member to support the connecting member, and the capping member covers the end of the connecting member, the capping member comprising:
   a first side wall configured to be coupled to a side of the flexible display panel;
   a second side wall opposite to the first side wall; and
   a plurality of holes located between the first side wall and the second side wall;
   wherein the first side wall and the second side wall are bendable with the side of the flexible display panel and a configuration of each of the plurality of holes are changeable during bending the first side wall and the second side wall,
   the capping member defining a positioning groove configured to be slidably coupled to the coupling member;
   wherein the coupling member comprises a hinge shaft, and the hinge shaft is capable of sliding from one end of the positioning groove to the other end of the positioning groove; and
   wherein a longitudinal geometric central line of the positioning groove and a longitudinal geometric central line of the connecting member are coplanar.

2. The capping member as claimed in claim 1, wherein the capping member further comprises an inner mounting surface and an outer surface opposite to the inner mounting surface, the inner mounting surface is located between the first side wall and the second side wall, the out surface is located between the first side wall and the second side wall, and the plurality of holes extend through the outer surface.

3. The capping member as claimed in claim 2, wherein the plurality of holes extend through the inner mounting surface.

4. The capping member as claimed in claim 2, wherein the outer surface is a curved surface protruding away from the inner mounting surface.

5. The capping member as claimed in claim 1, wherein an arrangement direction of plurality of holes is parallel to a longitudinal direction of the first side wall.

6. The capping member as claimed in claim 1, wherein a cross-sectional configuration of each of the plurality of holes is stripe-shaped, and a longitudinal direction of each of the plurality of holes is parallel to a longitudinal direction of the first side wall.

7. A housing assembly for an electronic device, the housing assembly comprising:
   a connecting member configured to support a flexible display panel of the electronic device, the connecting member comprising a connecting side overlapped with a side of the flexible display panel, the connecting side being bendable;

a coupling member facing the connecting member to support the connecting member; and a capping member comprising:

a first side wall configured to cover the connecting side and the side of the flexible display panel;

a second side wall opposite to the first side wall; and a plurality of holes located between the first side wall and the second side wall; wherein the first side wall and the second side wall are bendable with the side of the flexible display panel and a configuration of each of the plurality of holes are changeable during bending the first side wall and the second side wall, the capping member defining a positioning groove configured to be slidably coupled to the coupling member;

wherein the coupling member comprises a hinge shaft, and the hinge shaft is capable of sliding from one end of the positioning groove to the other end of the positioning groove; and wherein a longitudinal geometric central line of the positioning groove and a longitudinal geometric central line of the connecting member are coplanar.

8. The housing assembly as claimed in claim 7, wherein the housing assembly further comprises a first housing and a second housing, the connecting member is coupled between the first housing and the second housing, the second housing is rotatable with respect the first housing, and one end of the capping member is in contact with the first housing, the other end of the capping member is in contact with the second housing.

9. The housing assembly as claimed in claim 8, wherein the coupling member is coupled between the first housing and the second housing, and faces the connecting member to support the connecting member.

10. The housing assembly as claimed in claim 9, wherein the coupling member comprises at least one first hinge element and at least one second hinge element hinged with the at least one first hinge element.

11. The housing assembly as claimed in claim 7, wherein the capping member further comprises an inner mounting surface an outer surface opposite to the inner mounting surface, the inner mounting surface is located between the first side wall and the second side wall, the out surface is located between the first side wall and the second side wall, and the plurality of holes extend through the outer surface.

12. The housing assembly as claimed in claim 11, wherein the plurality of holes extend through the inner mounting surface.

13. The housing assembly as claimed in claim 11, wherein the outer surface is a curved surface protruding away from the inner mounting surface.

14. The housing assembly as claimed in claim 7, wherein an arrangement direction of plurality of holes is parallel to a longitudinal direction of the first side wall.

15. The housing assembly as claimed in claim 7, wherein a cross-sectional configuration of each of the plurality of holes is stripe-shaped, and a longitudinal direction of each of the plurality of holes is parallel to a longitudinal direction of the first side wall.

16. An electronic device, comprising:

a housing assembly comprising:

a connecting member configured to support the flexible display panel, the connecting member comprising a connecting side, the connecting side being bendable; and a coupling member facing the connecting member to support the connecting member;

a capping member comprising:

a first side wall configured to cover the connecting side, a second side wall opposite to the first side wall, and a plurality of holes located between the first side wall and the second side wall, wherein the capping member further defines a positioning groove, and the coupling member is slidably coupled to the positioning groove;

a flexible display panel positioned on the housing assembly and the first side wall of the capping member; and an electronic component group positioned in the housing assembly and electrically connected to the flexible display panel, wherein the coupling member comprises a hinge shaft, and the hinge shaft is capable of sliding from one end of the positioning groove to the other end of the positioning groove; and wherein a longitudinal geometric central line of the positioning groove and a longitudinal geometric central line of the connecting member are coplanar.

17. The electronic device as claimed in claim 16, wherein the housing assembly further comprises a first housing and a second housing, the connecting member is coupled between the first housing and the second housing, the second housing is rotatable with respect the first housing, and one end of the capping member is in contact with the first housing, the other end of the capping member is in contact with the second housing.

18. The electronic device as claimed in claim 17, wherein the housing assembly further comprises a coupling member, the coupling member is coupled between the first housing and the second housing, and faces the connecting member to support the connecting member.

19. The electronic device as claimed in claim 18, wherein the coupling member comprises at least one first hinge element and at least one second hinge element hinged with the at least one first hinge element.

* * * * *